(12) United States Patent
Yanasak et al.

(10) Patent No.: US 8,098,068 B2
(45) Date of Patent: Jan. 17, 2012

(54) SYSTEMS AND METHODS FOR PARAMETRIC MAPPING FOR CORRECTION OF NOISE-BASED SYSTEMATIC BIAS OF DTI METRICS, USING A DTI MAPPING PHANTOM

(75) Inventors: Nathan E. Yanasak, Crawfordville, GA (US); Tom C. Hu, Evans, GA (US)

(73) Assignee: Medical College of Georgia Research Institute, Inc., Augusta, GA (US)

( * ) Notice: Subject to any disclaimer, the term of this patent is extended or adjusted under 35 U.S.C. 154(b) by 283 days.

(21) Appl. No.: 12/321,340

(22) Filed: Jan. 15, 2009

(65) Prior Publication Data

US 2009/0190817 A1  Jul. 30, 2009

Related U.S. Application Data

(63) Continuation-in-part of application No. 12/220,172, filed on Jul. 21, 2008.

(60) Provisional application No. 60/961,458, filed on Jul. 20, 2007, provisional application No. 61/126,458, filed on May 5, 2008, provisional application No. 61/011,165, filed on Jan. 16, 2008, provisional application No. 61/011,166, filed on Jan. 16, 2008.

(51) Int. Cl.
*G01V 3/00* (2006.01)
(52) U.S. Cl. .......................... 324/309; 324/307
(58) Field of Classification Search ................. 324/309, 324/307; 600/410, 416
See application file for complete search history.

(56) References Cited

U.S. PATENT DOCUMENTS

| | | | |
|---|---|---|---|
| 5,969,524 A | 10/1999 | Pierpaoli et al. | |
| 6,288,540 B1 | 9/2001 | Chen | |
| 6,549,803 B1 | 4/2003 | Raghavan et al. | |
| 6,591,004 B1 | 7/2003 | Vanessen et al. | |
| 6,686,736 B2 | 2/2004 | Schoen et al. | |
| 6,815,952 B1 | 11/2004 | Rose et al. | |
| 6,845,342 B1 * | 1/2005 | Basser et al. | 702/183 |
| 6,969,991 B2 | 11/2005 | Bammer et al. | |
| 6,972,565 B2 | 12/2005 | Yokoi et al. | |
| 6,992,484 B2 | 1/2006 | Frank | |
| 7,330,026 B2 | 2/2008 | Wang et al. | |
| 7,346,382 B2 | 3/2008 | McIntyre et al. | |
| 7,355,403 B2 | 4/2008 | Chakraborty | |
| 7,408,345 B2 | 8/2008 | Bammer et al. | |
| 7,409,035 B2 | 8/2008 | Kaufman et al. | |

(Continued)

OTHER PUBLICATIONS

Alexander, Hasan, Lazar, Tsuruda, Parker, Analysis of Partial Volume Effects in Diffusion-Tensor MRI, Magnetic Resonance in Medicine, 2001, p. 770, vol. 45.

(Continued)

*Primary Examiner* — Louis Arana
(74) *Attorney, Agent, or Firm* — Gardner Groff Greenwald & Villanueva, PC

(57) ABSTRACT

A system and method for minimizing, if not completely eliminating, the systematic bias present in an MR system used for DTI is disclosed. A test object or "phantom" of the present invention is scanned with a desired DTI protocol. The eigenvalues measured with the phantom are compared to the actual values that should have been measured, and a parametric map that links measured eigenvalues to actual eigenvalues is calculated, which is applicable to the desired protocol. Future eigenvalue measurements using this protocol can be recalibrated to actual eigenvalues using this map.

20 Claims, 13 Drawing Sheets
(2 of 13 Drawing Sheet(s) Filed in Color)

U.S. PATENT DOCUMENTS

| | | | |
|---|---|---|---|
| 7,411,393 | B2 | 8/2008 | Zhang |
| 7,529,422 | B2 | 5/2009 | Wang et al. |
| 7,570,049 | B2 * | 8/2009 | Lange ............................ 324/307 |
| 7,643,863 | B2 | 1/2010 | Basser et al. |
| 7,660,481 | B2 | 2/2010 | Schaap et al. |
| 7,775,980 | B2 | 8/2010 | Sumi |
| 7,834,627 | B2 * | 11/2010 | Sakai et al. .................... 324/318 |
| 2010/0004527 | A1 | 1/2010 | Dale et al. |
| 2011/0074423 | A1 | 3/2011 | Krzyzak |

OTHER PUBLICATIONS

Anderson, Theoretical analysis of the effects of noise on diffusion tensor imaging, 2001, pp. 1174-1188, vol. 46, Magn Reson Med.

Ardekani, Selva, Sayer, Sinha, Quantitative Metrics for Evaluating Parallel Acquisition Techniques in Diffusion Tensor Imaging at 3 Tesla, Investigative Radiology, 2006, p. 806, vol. 41.

Assaf, Freidlin, Rohde, Basser, New Modeling and Experimental Framework to Characterize Hindered and Restricted Water Diffusion in Brain White Matter, Magnetic Resonance in Medicine, 2004, p. 965, vol. 52.

Bammer, Auer, Keeling, Augustin, Stables, Prokesch, et al., Diffusion tensor imaging using single-shot Sense-EPI, 2002, pp. 128-136, vol. 48, Magn Reson Med.

Basser, Mattiello, Le Bihan, MR diffusion tensor spectroscopy and imaging, 1994, pp. 259-267, vol. 68, Biophys J.

Basser, Pajevic, Statistical artifacts in diffusion tensor MRI (DT-MRI) caused by background noise, 2000, pp. 41-50, vol. 44, Magn Reson Med.

Basser, Pierpaoli, Microstructural and physiological features of tissues elecidated by quantitative-diffusion-MRI tenso, 1996, pp. 209-219, vol. B111.

Bastin, Armitage, Marshall, A theoretical study of the effect of experimental noise on the measurement of anisotropy in diffusion imaging, 1998, pp. 773-785, Magn Reson Imaging.

Beaulieu, The basis of anisotropic water diffusion in the nervous system—a technical review, 2002, pp. 435-455, vol. 15, NMR Biomed.

Caan, De Vries, Khedoe, Akkerman, Van Vliet, Grimberger, Vos, Generating fiber crossing phantoms out of experimental DWIs, in Proceedings of the 2007 Medical Image Computing and Computer-Assisted Intervention (MICCAI) Conference, 2007.

Chang, Koay, Pierpaoli, Basser, Variance of estimated DTI-derived parameters via first-order perturbation methods, 2007, pp. 141-149, vol. 57, Magn Reson Med.

Chen, Hsu, Noise removal in magnetic resonance diffusion tensor imaging, 2005, pp. 393-407, vol. 54, Magn Reson Med.

Chen. B et al, Correction for direction-dependent distortions in diffusion tensor imaging using matched magnetic field maps, NeuroImage, 2006, pp. 121-129, vol. 30.

Chung, Lu, Henry, Comparison of bootstrap approaches for estimation of uncertainties of DTI parameters, 2006, pp. 531-541, vol. 33, Neuroimage.

Cook, Bai, Hall, Nedjati-Gilani, Seunarine, Alexandcer, Camino: Diffusion MRI reconstruction and processing, Cetre for Medical Image Computing, Department of Computer Science, University College London, UK.

Cook, Bai, Nedjati-Bilani, Seunarine, Hall, Parker, Alexander, Camino: Open-Source Diffusion-MRI Reconstruction and Processing, in Proceedings of the 14th Scientific Meeting of the ISMRM (2006), p. 2759, abstract #.

Dice, Measure of the Amount of Ecologic Association Between Species, Ecology, 1945, p. 297, vol. 25.

Dietrich, Heiland, Sartor, Noise correction for the exact determination of apparent diffustion coefficient at low SNR, 20001, pp. 448-453, vol. 45, Magn Reson Med.

Ding, Gore, Anderson, Reduction of noise in diffusion tensor images using anisotropic smoothing, 2005, pp. 485-490, vol. 53, Magn Reson Med.

Facon, Ozanne, Fillard, Tournoux-Facon, MR Diffusion Tensor Imaging and Fiber Tracking in Spinal Cord Compression, American Journal of Neuroradiology, 2007, p. 411, vol. 28.

Fieremans, Deene, Delputte, Ozeemir, Achten, Lemahieu, The design of anisotropic diffusion phantoms for the validation of diffusion weighted magnetic resonance imaging, 2008, vol. 53.

Griswold, Jakob, Heidemann, Nittka, Jellus, Wang, Kiefer, Hasse, Generalized Autocalibrating Partially Parallel Acquisitions (GRAPPA), Magnetic Resonance in Medicine, 2002, p. 1201, vol. 47.

Gudbjartsson, Patz, The Rician distribution of noisy MRI data, 1995, pp. 910-914, vol. 34, Magn Reson Med.

Hagemen et al., A Diffusion Tensor Imaging Tractography Algorithm Based on Navier-Stokes Fluid Mechanics, 3rd IEEE international symposium on biomedical imaging: macro to nano, 2006, pp. 798-801.

Hagmann, DTI mapping of human brain connectivity: statistical fire tracking and virtual dissection, 2003, pp. 545-554, vol. 19, Neuroimage.

Hasan, Parker, Alexander, Magnetic Resonance Water Self-Diffusion Tensor Encoding Optimization Methods for Full Brain Acquisition, Image Analysis and Stereology, 2002, p. 87, vol. 21.

Horsfield, Jones, Applications of diffusion-weighted and diffusion tensor MRI to white matter diseases: a review, 2002, p. 570-577, vol. 15, NMR Biomed.

Horsfield, Using diffusion-weighted MRI in multicenter clinical trials for multiple sclerosis, 2001, pp. S51-S54, vol. 186, J Neurol.

Jellison, Field, Medow, Lazar, Salamat, Alexander, Diffusion Tensor Imaging of Cerebral White Matter: A Pictorial Review of Physics, Fiber Tract Anatomy, and Tumor Imaging Patterns, American Journal of Neuroradiology, 2004, pp. 356, vol. 25.

Jenkinson, A fast, automated, n-dimensional phase unwrapping algorith, Magnetic Resonance in Medicine, 2003, pp. 193-197, vol. 49.

Jones, Basser, "Squashing peanuts and smashing pumpkins": how noise distorts diffusion-weighted MR data, 2004, pp. 979-993, vol. 52, Magn Reson Med.

Koay, Chang, Carew, Pierpaoli, Basser, A unifying theoretical and algorithmic framework for least squares methods of estimation in diffusion tensor imaging, Journal of Magnetic Resonance, 2006, p. 115, vol. 182.

Landman, Farrell, Jones, Smith, Prince, Mori, Effects of diffusion weighting schemes on the reporucibility of DTI-derived fractional anisotropy, mean diffusivity, and principal eigenvector measurements 1.5T, NeuroImage, 2007, p. 1123, vol. 36.

Le Bihan, Breton, Lallemand, Grenier, Cabanis, Laval-Jeanet, MR imaging of intravoxel incoherent motions: application to diffusion and perfusion in neurologic disorders. 1986, pp. 401-407, vol. 161, Radiology.

Le Bihan, Mangin, Poupon, Calrk, Pappata, Molkko, et al., Diffusion tensor imaging: concepts and applications, 2001, pp. 534-546, vol. 13, J Magn Reson Imaging.

Lin, Validation of Diffusion Tensor Magnetic Resonance Axonal Fiber Imaging with Registered Manganes-Enhanced Optic Tracts, NeuroImage, 2001, p. 1035, vol. 14.

Mori, Frederiksen, Van Zijl, Stieltjes, Kraut, Solaiyappan, et al., Brain white matter anatomy of tumor patients evaluated with diffusion tensor imaging, 2002, pp. 377-380, vol. 51, Ann Neurol.

Pagani, Bammer, Horsfiel, Rovaris, Gass, Ciccarelli, Filippi, Diffusion MR Imaging in Mulltiple Sclerosis: Technical Aspects and Challenges, American Journal of Neuroradiology, 2007, pp. 411, vol. 28.

Panin et al., Diffusion tensor MR imaging of principal directions: a tensor tomography approach, Phys Med Biol, 2002, pp. 2737-2757, vol. 47.

Parker, Schnabel, Symms, Wehring, Barker, Nonlinear smoothing for reduction of systematic and random errors in diffusion tensor imaging, 2000, pp. 702-710, vol. 11, J Magn Reson Imaging.

Peled et al., Geometrically constrained two-tensor model for crossing tracts in DWI, Mag Reson Imaging, 2004, pp. 1263-1270, vol. 24.

Pierpaoli, Basser, Toward a quantitative assessment of diffusion anisotropy, 1996, pp. 893-906, vol. 36, Magn Reson Med.

Poupon, Perrin, Rieul, Mangin, Bihan, Validation of Q-Ball imaging with a diffusion fiber crossing phantom on a clinical scanner, poster presentation at the ISMRM Workshop on Methods for Quantitative Diffusion MRI of Human Brain, 2005.

Poupon, Rieul, Kezele, Perrin, Poupon, Mangin, New diffusion phantoms dedicated to the study and validation of high-angular resolution diffusion imaging (hardi) models, 2005, Magnetic Resonance in Medicine, vol. 60.

Pruessmann, Weiger, Scheidegger, Boesing, Sense: sensitivy encoding for fast MRI, pp. 952-962, vol. 42, Magn Reson Med.

Schluter et al., White Matter Lesion Phantom for Diffusion Tensor Data and Its Application to the Assessment of Fiber Tracking, Proc SPIE—The Intl Soc for Optical Engg., 2005, pp. 835-844, vol. 5746.

Skare, Li, Nordell, Ingvar, Noise considerations in the determination of diffusion tensor anistropy, 2000, p. 659-669, vol. 18, Magn Reson Imaging.

Stejskal, Tanner, Spin Diffusion Measurements, Journal of Chemical Physiscs, 1965, p. 488, vol. 41.

Sullivan, Pfefferbaum, Diffusion tensor imaging in normal aging and neuropsychiatric disorder, 2003, p. 244-255, vol. 45, Eur J Radiol.

Sundgren, Dong, Gomez-Hassan, Mukherji, Maly, Welsh, Diffusion tensor imaging of the brain: review of clinical applications, 2004, pp. 339-350, vol. 46, Neuroradiology.

Taouli, Martin, Qayyum, Merrimand, Vigernon, Yeh, Coakley, Parallel Imaging and Diffusion Tensor Imaging for Diffusion-Weighted MRI of the Liver: Preliminary Experience in Healthy Volunteers, American Journal of Neuroradiology, 2004, p. 677, vol. 183.

Thoeny, Dekeyzer, Oyen, Peeters, Diffusion-weighted MR Imaging of Kidneys in Healthy Volunteers and Patients with Parenchymal Diseases: Initial Experience, Raidology, 2005, pp. 911, vol. 235.

Tuch et al., Diffusion MRI of Complex Neural Architecture, Neuron, 2003, pp. 885-895, vol. 40.

Tuch, Reese, Wiegell, Makris, Belliveau, Wedeen, High Angular Resolution Diffusion Imaging Reveals Intravoxel White Matter Fiber Heterogeneity, Magnetic Resonance in Medicine, 2022, p. 577, vol. 48.

Von Dem Hagen, Henkelman, Orientational Diffusion Reflects Fiber Structure Within a Voxel, Magn. Reson. Med., 2002, p. 454, vol. 48.

Yanasak, Allison, Use of capillaries in the construction of an MRI phantom for assessment of diffusion tensor imaging: demonstration of performance, 2006, pp. 1349-1361, vol. 24, Magn Reson Imaging.

Zhuang J. et al., Correction of Eddy-Current Distortions in Diffusion Tensor Images Using the Known Directions and Strengths of Diffusion Gradients, J Magn Reson Imag., 2004, pp. 1263-1270, vol. 24.

Zou, Warfield, Bharatha, Tempany, Kaus, Haker, Wells, Jelesz, Kikinis, Statistical Validation of Image Segmentation Quality Based on a Spatial Overlap Index; Academic Radiology, 2004, p. 178, vol. 11.

Schott North America, Inc.; Components Enabling Biotechnology Research; www.us.schott.com; 2 pages; printed Feb. 11, 2011.

* cited by examiner

US 8,098,068 B2

SYSTEMS AND METHODS FOR PARAMETRIC MAPPING FOR CORRECTION OF NOISE-BASED SYSTEMATIC BIAS OF DTI METRICS, USING A DTI MAPPING PHANTOM

CROSS-REFERENCE TO RELATED APPLICATION

This application is a continuation-in-part of U.S. patent application Ser. No. 12/220,172 filed on Jul. 21, 2008, which claims the benefit of the filing date of U.S. Provisional Patent Application Ser. Nos. 60/961,458 filed on Jul. 20, 2007; 61/126,458 filed on May 5, 2008; 61/011,165 filed on Jan. 16, 2008; and 61/011,166 filed on Jan. 16, 2008. This application further claims the benefit of the filing date of U.S. Provisional Patent Application Ser. Nos. 61/126,458 filed on May 5, 2008; 61/011,165 filed on Jan. 16, 2008; and 61/011,166 filed on Jan. 16, 2008. The disclosures of all of these applications are incorporated by reference in their entireties for all purposes.

TECHNICAL FIELD

The present invention relates generally to the field of medical imaging, and particularly to systems and methods for parametric mapping for correction of noise-based systematic bias of DTI metrics, using a DTI mapping phantom.

BACKGROUND OF THE INVENTION

Diffusion tensor imaging (DTI) is an MRI-based technique with great potential to enhance clinical diagnosis of pathology in structured tissue. In particular, DTI has shown promise in the area of neurological disease, exhibiting some sensitivity to identifying white-matter tumor extent, sclerotic lesions, and compression trauma in spine. In clinical research, DTI has been used to map white matter fiber trajectories in the brain. Other pathology that may be favorably characterized with DTI includes liver and renal diseases.

Despite its utility, the routine diagnostic application of DTI remains in its infancy. Reasons for this include that, considering the large amount of information that DTI provides as compared to an ordinary MR sequence, the clinical adoption of standardized protocols is lagging. During a DTI sequence, a series of images are generated by applying gradient magnetic fields along particular directions, to measure the directional dependence of diffusion. DTI reduces this series of measurements to a tensor at every image location, with each eigenvalue (sometimes referred to as "e-value") and eigenvector representing the apparent diffusion coefficient (ADC) values along principle axes of an ellipsoid. Precision of the measurements depends on the number of directions sampled and the choice of particular direction schemes. Furthermore, DTI measurements characterize tissue properties indirectly, including cellular size, orientation, heterogeneity, and cell permeability. Uncertainty persists in the understanding of how DTI measures correlate with these tissue characteristics and how they change with disease.

Procedures for quality assurance (QA) and for estimation/measurement of systematic uncertainty have yet to be developed for DTI. In comparison with a single intensity value per voxel measured using a T1-weighted MR sequence, the end-product of a DTI series is six values to define a tensor within a given reference frame, where the frame is defined by three orthogonal vectors. As expected, the effect of noise on DTI data is more complicated than for routine clinical images, leading to a systematic bias that depends on SNR (signal to noise ratio). In an effort to eliminate image distortion inherent to the echo-planar imaging sequences predominantly used in the clinic and to migrate to higher-resolution imaging, parallel imaging has been incorporated with DTI. Unfortunately, while the array coils necessary for parallel MR scanning systems show improved SNR overall, their use changes the spatial properties of the noise distribution over the image. This effect of non-uniformity in the spatial sensitivity of surface coils is enhanced further using parallel imaging, leading to regions where noise may be higher or have variable spatial correlation, decreasing sensitivity within these regions.

Another complication with DTI QA procedures is the lack of a suitable test object, to evaluate and correct systematic bias. Diffusion depends on temperature, so thermal stability of such objects can also be important.

SUMMARY OF THE INVENTION

In example embodiments, the present invention provides a system and method for minimizing, if not completely eliminating, the systematic bias present in an MR system used for DTI. The user scans a test object or "phantom" of the present invention with a desired DTI protocol. The eigenvalues measured with the phantom are compared to the actual values that should have been measured, and a parametric map that links measured eigenvalues to actual eigenvalues is calculated, which is applicable to the desired protocol. Future eigenvalue measurements using this protocol can be recalibrated to actual eigenvalues using this map, thereby minimizing if not completely eliminating, the systematic bias present in the MR system.

In one form, the present invention provides a method of scanning the phantom using the desired DTI protocol; verifying eigenvalue determination before or after use of a known sorting procedure; and creating the parametric map for future use after DTI scanning with the same protocol.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

DETAILED DESCRIPTION OF EXAMPLE EMBODIMENTS

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

The present invention provides a system and method for providing quality assurance of ADC ("apparent diffusion coefficient") values obtained when scanning an object, such as tissue of a human or animal subject, with a DTI sequence of an MRI scanner. As a spatial distribution of ADC values are used to calculate other clinical metrics of DTI (e.g., fractional anisotropy), this invention also can provide quality assurance of DTI metrics in general. Additionally, the present invention also provides a phantom or test object that can be scanned by an MRI using a DTI (or other) sequence to provide a baseline reading for DTI analysis of tissue of a human or animal subject. Accordingly, once a baseline is obtained, a practitioner can employ one or more methods of the present invention to scan tissue of a human or animal subject to separate apparent anomalies in the tissue from systematic bias in DTI.

Figure 1:
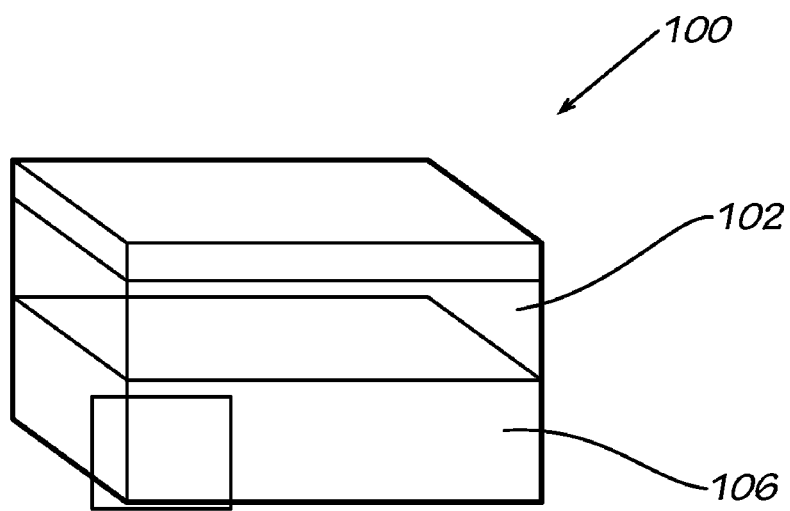
FIG. 1 depicts a perspective view of a phantom for use with DTI imaging according to a first example embodiment.
Figure 2:
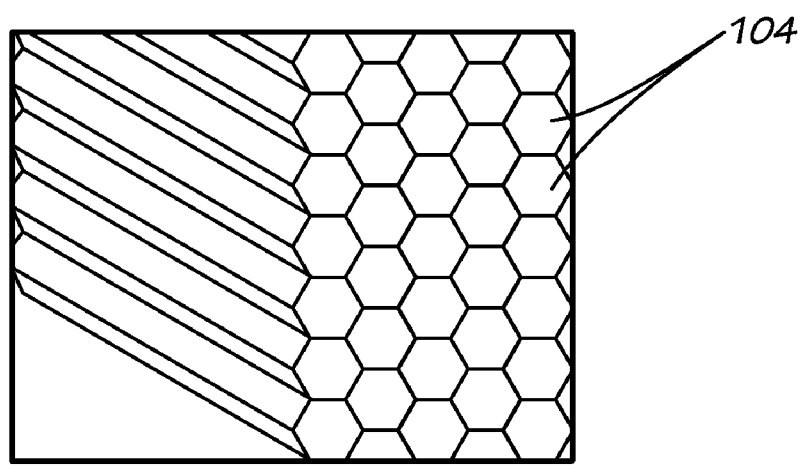
FIG. 2 depicts a detailed view of a portion of the phantom of FIG. 1.

PHANTOM EXAMPLES the present invention provides example phantoms or test objects that can be scanned to provide a baseline reading for DTI analysis of tissue of a human or animal subject. As shown in FIGS. 1 and 2, in a first example embodiment, the phantom 100 includes a housing 102 that contains a one assembly of a plurality of capillary arrays 104 therein, with each capillary closely abutting adjacent capillary arrays. Together, the plurality of capillary arrays 104 forms a macro-array 106. Hereafter, any larger-scale assembly of capillary arrays shall be referred to as a "macro-array". As shown, each capillary array 104 is hexagonal in shape. The hexagonal shapes of the capillary arrays 104 within the housing 102 facilitate stacking of the capillary arrays into the macro-array, which as shown in FIG. 1 is generally rectangular in appearance and conforms to the shape of housing 102. However, those skilled in the art will understand that the capillary arrays can be any suitable size or shape, such as trapezoidal, triangular, octagonal, rectangular, etc.

Figure 3:
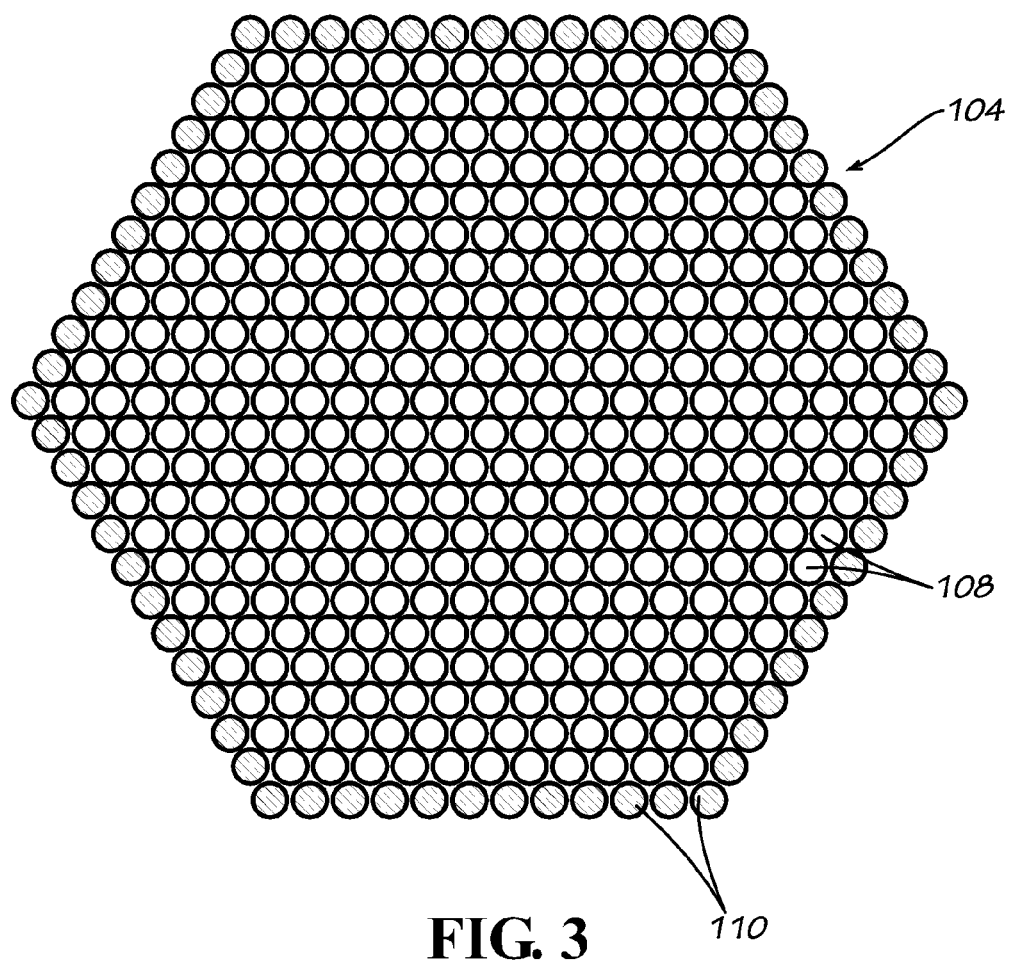
FIG. 3 depicts a sectional view of one capillary array in FIG. 2.

Preferably, each capillary array 104 includes a plurality of glass capillaries 108 therein, as shown in FIG. 3. In a typical example embodiment, glass capillaries 108 are used because they are generally easier to manufacture with high-precision diameters. Additionally, the formulation of glass can be such that its magnetic susceptibility can be closely matched to that of water. However, those skilled in the art will understand that other suitable materials, such as plastics, can be used for the capillaries 108. In a typical example embodiment, each capillary's internal diameter is between about 5 and 100 microns and more preferably between about 10 and 80 microns. Preferably, all of the capillaries 108 are completely filled with water, although in alternative embodiments, the capillaries can be substantially or partially filled with water. Optionally, each capillary can include an amount of a suitable contrast dopant. An exemplary capillary array 104 is a hexagonal capillary array having 397 capillaries 108 and 1470 interstitial pores of lesser volume with the whole array bounded by a layer of solid glass rods 110, as manufactured by Schott North America, Inc. (Southbridge, Mass.) and shown in FIG. 3. Preferably, the diameter of each glass rod 110 is equal to or substantially equal to the diameter of each capillary 108. Also preferably, the capillaries 108 and the glass rods 110 are in a close-packed hexagonal arrangement. Those skilled in the art will understand that other suitable capillary arrays of other sizes and shapes can be employed as well.

Referring back to FIG. 1, the housing 102 can be constructed from any suitable material having a magnetic susceptibility that can be somewhat matched to that of water. Exemplary materials include polypropylene, polyethylene, glass, and PMMA, although those skilled in the art will understand that other suitable materials can be employed as well. In the depicted embodiment, the housing 102 has a substantially box-like shape measuring about one inch by about one inch by about one inch, although those skilled in the art will understand that such dimensions are exemplary and can vary and that any suitable size and shape of housing can be used. For example in an alternative embodiment, a cylindrical housing with a screwtop lid can be employed.

The plurality of capillary arrays 104 can be bound together into the macro-array 106 with a water absorbent material, such as cotton string (not shown for purposes of clarity). In alternative embodiments, the capillary arrays 104 can be held together with a somewhat of an interference fit (such as a mechanical or pressure fit) if the housing is only slightly larger than the macro-array, thereby providing a mechanical force against the macro-array. Those skilled in the art will understand that other suitable devices and techniques can be used to secure the capillary arrays 104 together and/or secure the macro-array within the housing so as to prevent the macro-array from moving while the phantom 100 is scanned.

As shown in FIG. 1 in the first example embodiment, all of the hexagonal capillary arrays 104 are aligned in the same direction and stacked on top of each other in the housing 102. The bottom row of capillary arrays 104 (i.e., the row of capillary arrays at the base of the housing) includes a series of voids 112 (or channels) between adjacent arrays. Similarly (and though not shown in the drawings for purposes of clarity), the top row of arrays 104 (i.e., the row of capillary arrays near the top or lid of the housing) includes a similar series of voids (or channels) between adjacent arrays. Alternatively, the top and bottom rows of arrays can include alternating hexagonal arrays and trapezoidal (i.e., "half-hexagonal") arrays that abut each other so as to create a hexagonal pattern with minimal or no space between adjacent arrays or between the arrays and the base of the housing. In another alternative form, instead of hexagonal arrays, all of the arrays can be trapezoidal, thereby providing an arrangement without the voids of FIG. 1.

In a typical example embodiment, there are generally enough capillary arrays 104 to fill or substantially fill the housing 102. A sufficient amount of water (such as distilled water) is placed inside of the housing and hence fills any voids between the arrays and between the arrays and the housing. In alternative embodiments, the macroarray of capillary arrays 104 fill only a portion of the housing 102. In such an embodiment, it may be advantageous to place a weight, such as a water-saturated piece of material (such as cotton) or fabric, on the macro-array 106 so as to keep the capillary arrays 104 in a tightly stacked configuration. However, when hexagonal or trapezoidal capillary arrays 104 are used, there is a natural tendency for the macro-arrays to stack in a tight configuration in shape.

The phantom 100 can be scanned with an MRI using a DTI sequence of the present invention to image the prolate ADC distributions in a region of interest ("ROI") containing the capillaries 108. Data from scans of the phantom 100 in this configuration can then be used to synthesize other distributions.

Figure 4:
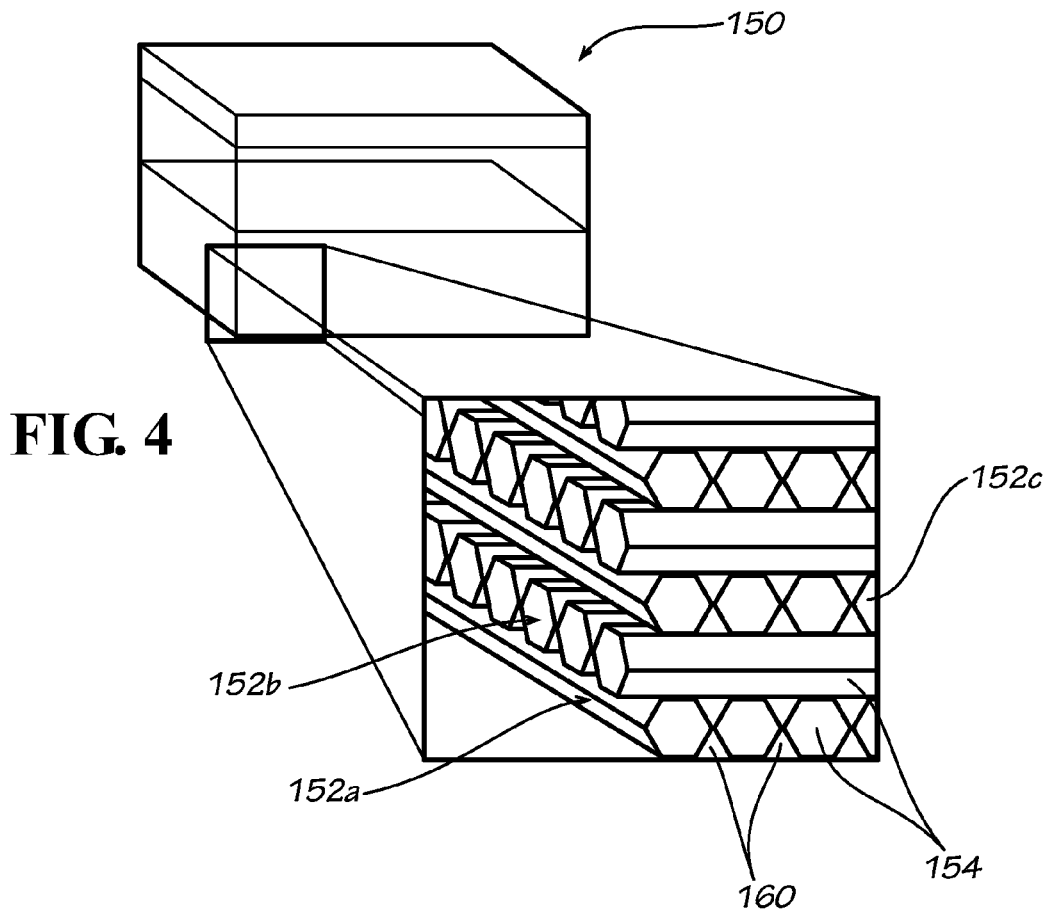
FIG. 4 depicts a perspective view of a phantom for use with DTI imaging according to a second example embodiment.

A second example embodiment of a phantom 150 is shown in FIG. 4. The phantom 150 is substantially similar to the phantom 100, but with the exceptions noted herein. Preferably, each row 152a-152n or layer of the capillary arrays 154 is rotated 90° relative to the previous layer, thereby creating alternating rows of arrays, as generally shown in FIG. 4. In other words, the capillary axes of each row are generally perpendicular to the two adjacent rows. As such, the phantom 150 generally behaves as a two-tensor diffusion distribution because of volume averaging of the crossing capillary layers. The data from the phantom 150 of this configuration can be used to confirm the general shape of a two-tensor diffusion distribution.

Notably, this stacking pattern of capillary arrays 154 in the phantom 150 allows more water to be located outside of the arrays, as shown by arrows 160. For example, the water 160 located outside of the arrays 154 can be approximately 40% by water volume. Because of the increase in water external to the arrays 154 (as compared to the phantom 100 of FIG. 1), higher ADC values in all directions and lower anisotropy can be expected.

In an alternative embodiment, the shapes of the arrays 154 can be trapezoidal. With such construction of rows rotated 90° relative to adjacent rows, flat layers of arrays can be built with alternating layers of capillaries (with fewer voids than that of FIG. 4), where the capillaries in each matrix (or row) can point to an arbitrary angle to other planes. Accordingly, the ADC values remain close to the same per plane of trapezoidal arrays.

Figure 5:
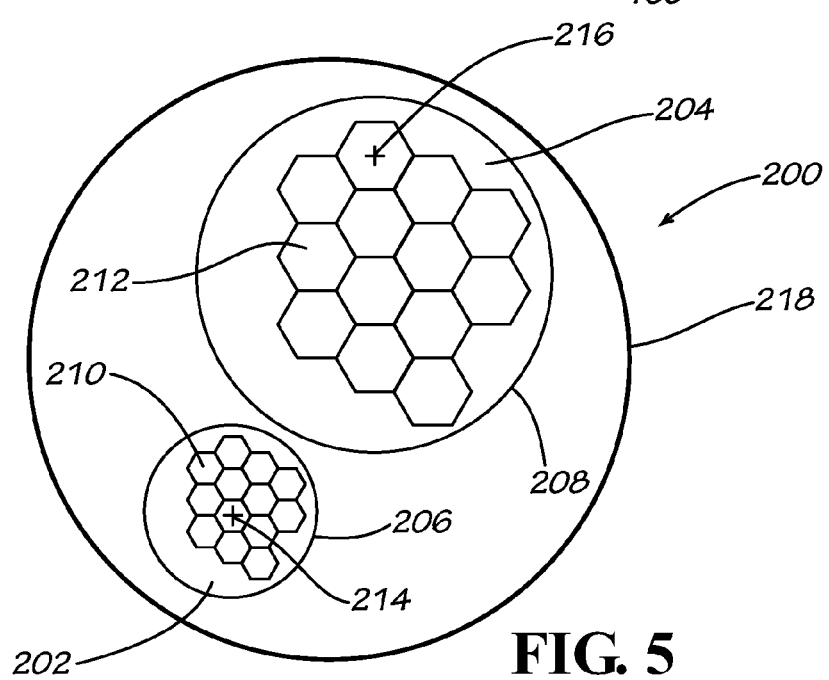
FIG. 5 depicts a sectional view of a phantom for use with DTI imaging according to a third example embodiment.

A third example embodiment of a phantom 200 is shown in FIG. 5. The phantom 200 includes two arrays 202, 204 of water-filled capillaries, each housed within an undoped water-filled glass housing 206, 208 such as a glass vial. Together the two arrays 202, 204 form a macro-array. The first array 202 has thirteen water-filled capillary arrays 210 bound together, with each capillary in the capillary array having an inner diameter of approximately 23 μm. The approximate diameter of the first array 202 is thus 4 mm. The second array 204 has thirteen water-filled capillary arrays 212 bound together, with each capillary in the capillary array having an inner diameter of approximately 83 μm. The approximate diameter of the second array 204 is thus 8 mm. One standard deviation (S.D.) of error in measuring these diameters is equal to about 2 μm. Both the first and second arrays 202, 204 are approximately 8-10 mm in length. Preferably, the capillary axes 214, 216 for both arrays 202, 204 are oriented approximately normal to the axial image plane. Preferably, the first and second arrays 202, 204 are bound together such as with a cotton string.

Prior to imaging, the glass housings 206, 208 can be placed into a single water-filled container 218, such as an approximately 0.6 liter polypropylene container although other suitable containers can be used. Accordingly, the phantom 200 can accommodate voxel sizes typical of a clinical procedure (i.e., approximately 1-10 $mm^3$) and can be used to study the effect of SNR on DTI eigenvalues using a clinical MRI scanner. Both arrays 202, 204 can be imaged in at least one 2D axial plane of approximately 3 mm thickness.

Optionally, the water in the housings 206, 208 and/or the container 218 can be lightly doped with a suitable contrast dopant, such as copper sulfate (CuSO4), Gd-DPDT, or heavy water (deuterium oxide or D2O), to allow for shorter TR and/or TE, to alter the signal intensity, and to decrease sequence duration. The phantom 200 can be employed to examine the effect of iteration on sorting procedures. Additionally, heavy water may provide certain additional advantages over other contrast dopants. Heavy water has virtually the same properties as normal water, with the exception that the hydrogen nucleus in heavy water contains an extra neutron. So, heavy water diffuses at approximately the same rate and has approximately the same magnetic susceptibility as normal water, but heavy water is not visible using a standard MRI sequence. So, in a compartment having a mixture of equal parts of normal water and heavy water, the image of that compartment will be about 50% the signal (and SNR) of that of a compartment of normal water. Accordingly, the SNR can be adjusted without adjusting the $T_1$ or $T_2$ relaxation.

Figure 6:
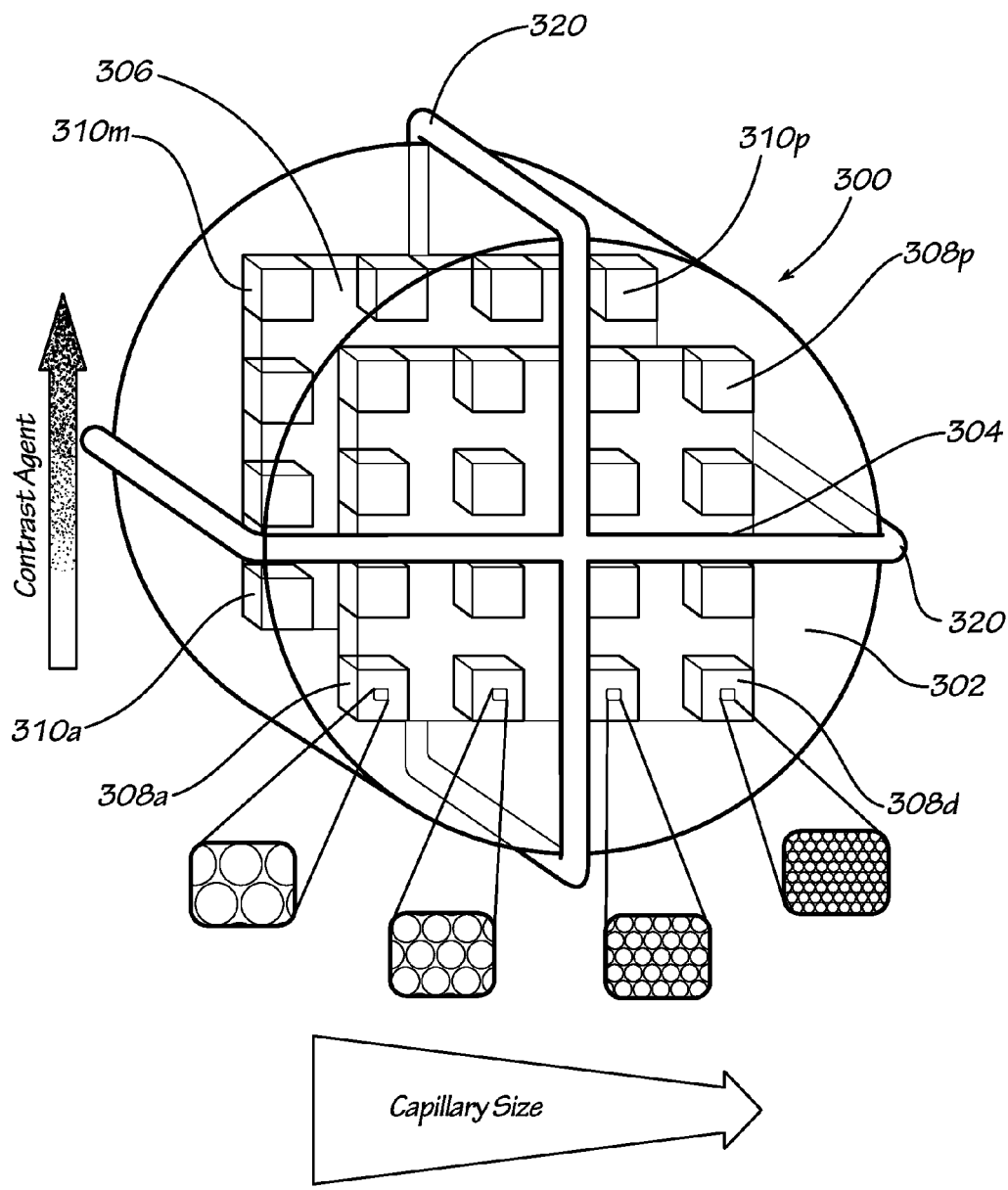
FIG. 6 depicts a perspective view of a phantom for use with DTI imaging and showing a detailed view of a portion of the arrangement of macro-arrays according to a fourth example embodiment.
Figure 7:
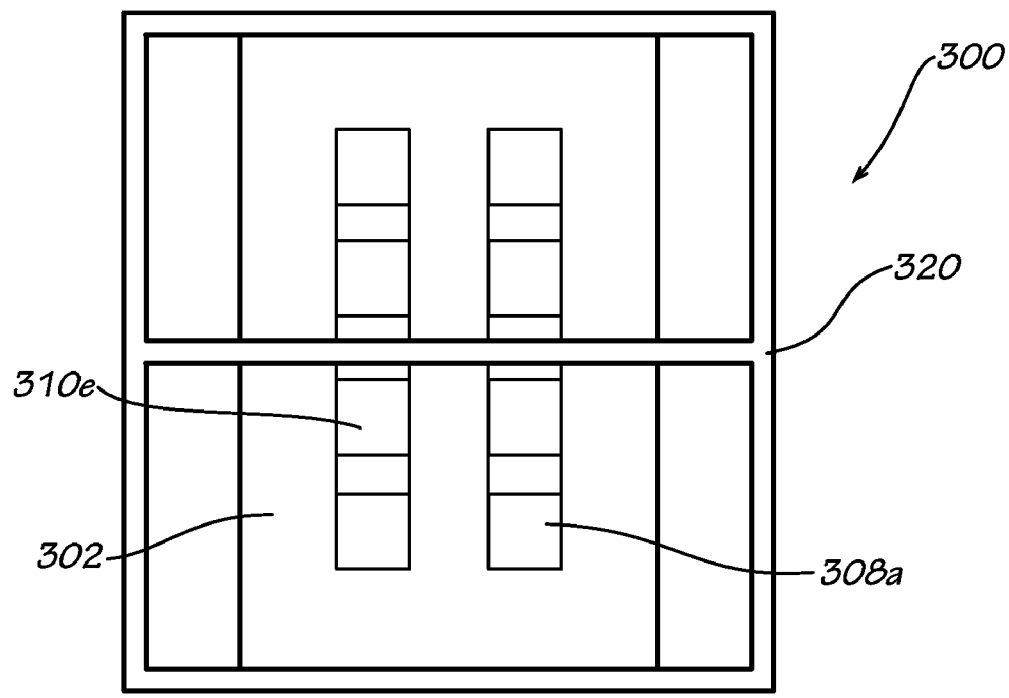
FIG. 7 depicts a side view of the phantom of FIG. 6.
Figure 8:
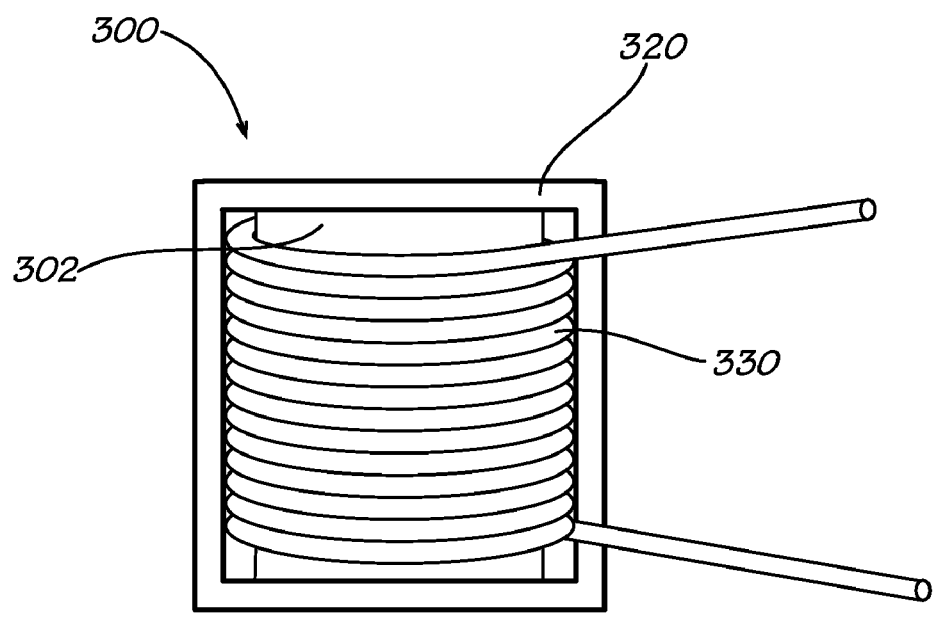
FIG. 8 depicts a side view of the phantom of FIG. 6 and shown wrapped with thermal tubing.

A fourth example embodiment of a phantom 300 is shown in FIGS. 6-8. Advantageously, the phantom 300 includes a variety of different sized structures so as to produce an initial range of eigenvalues, from the differences in diffusion properties arising from the structures in each compartment. An initial range of SNR values can be specified by the use of a contrast dopant to increase or decrease the image intensity.

The phantom 300 includes a water-filled housing 302. Preferably, the housing 302 is permanently sealed such that the water cannot escape the housing. Alternatively, the housing 302 can include a removable lid with a watertight seal. In the depicted embodiment, the housing 302 has a generally cylindrical shape, although those skilled in the art will understand that other suitable shapes for the housing can be employed as well. In a typical example embodiment, the size and shape of the housing 302 approximates the size and shape of a human head or brain. For example, the diameter can be between approximately 8-12 inches in diameter and the length can be about 5-6 inches. Those skilled in the art will understand that such dimensions are exemplary and can vary in other embodiments. The housing 302 can be constructed of any suitable material such as, but not limited to, polypropylene, polyethylene, PMMA, or glass.

The housing 302 encases a plurality of matrices of discrete compartments. In the depicted embodiment, the housing 302 encases two matrices 304, 306 of compartments, each having sixteen discrete and spaced-apart compartments 308a-308p, 310a-310p, although those skilled in the art will understand that only one or a plurality of matrices can be employed and that fewer or additional compartments can be used. In a typical example embodiment, the compartments 308a-308p, 310a-310p are generally cubical in shape and measuring about one cubic inch, although those skilled in the art will understand that such shape is not critical and that any suitable sized and shaped compartment can be used. Adjacent compartments can be spaced about one inch apart, While in an alternative embodiment, adjacent compartments can closely abut each other.

The first matrix 304 includes sixteen compartments 308a-308p, namely four rows by four columns of compartments. Each compartment 308a-308p is preferably spaced apart from the others and secured to a wall of the housing 302. As depicted, the compartments 308a-308p are attached to the inner face of the cylindrical housing 302. Alternatively, each compartment 308a-308p can be attached to a disk-like plate that is secured within the housing 302.

Each compartment 308a-308p encases a single macro-array of a plurality of capillary arrays having capillaries of a single inner diameter, but each column of compartments preferably includes capillaries having differing inner diameters. The configurations of the arrays are substantially similar to that of FIGS. 1-4, with the notable difference being the size of the individual capillaries. Preferably, all of the arrays are aligned in each compartment 308a-308p such that the capillary axes point in the longitudinal axis of the cylinder. Alternatively, the stacking pattern of capillary arrays as shown in FIG. 2 can be employed.

The first column includes capillaries of a first diameter; the second column includes capillaries of a second diameter (which is different than the first); the third column includes capillaries of a third diameter (which is different than the first and second); and the fourth column includes capillaries of a fourth diameter (which is different than the first, second, and third). Preferably, the various compartments in a row span a reasonable range of diameters that is clinically relevant. Accordingly, the change in diameter size depends, in part, on the number of compartments and the range spanned. Assuming a range of approximately 20 to 80 microns (which is a clinically relevant range) and four compartments, the inner diameters of the capillaries of the arrays of the four columns are 82, 51, 32, and 20 microns, respectively. Thus, the size of the capillaries varies by about 60% between adjacent compartments. Accordingly, such arrangement of compartments results in a range of different eigenvalues to be measured.

The first row of compartments 308a-308d, each is filled with normal water. The remaining compartments 308e-308p are each filled with a mixture of water and a contrast dopant that surrounds the arrays. As explained above, such dopants can include, but are not limited to, (CuSO4), Gd-DPDT, and heavy water. Each compartment in each row has the same specified amount of applied dopant, but preferably the amount of dopant varies among the rows. Thus, when the first matrix 304 of the phantom 300 is imaged using a DTI sequence, the eigenvalue along the axis of each array is the same for each compartment given distilled or doped water as the compartment fillant, while the two smallest eigenvalues spanning across the diameter of the capillaries should get smaller with smaller diameter. Those skilled in the art will understand how to construct other suitable ranges and arrangements.

The second matrix 306 is substantially similar to the first, with the notable difference being that there are no capillaries or arrays in any of the compartments 310a-310p. Rather, each compartment contains only water and optionally a dopant. In other words, the compartments 310a-310d include only water, while the compartments 310e-310p include a mixture of water and dopant. Typically, the number and shape of the compartments 310-310p of the second matrix 306 generally mirror that of the first matrix 304. Each column of compartments of the second matrix 306 can be identical to that of the other columns, as the amount of dopant varies between the rows. Preferably, the amount of dopant applied to each to each compartment 310 provides the same or substantially similar concentration as that of the corresponding compartment of the first matrix 304. Those skilled in the art will understand that a single column can be used, but preferably, a matrix of compartments having the same number as the first matrix is used to determine how noise varies across the image plane.

Nominally, DTI imaging of the water-filled compartments 310a-310p of the second matrix 306 should result in measurements of isotropic diffusion, whereas, the macro-array-filled compartments 308a-308p should show diffusion occurring more freely along the capillary array axis and more restricted across the diameter of the capillaries.

The increase in dopant allows for the SNR of each compartment to vary along this direction by shortening either a) the $T_1$-relaxation time to decrease magnetic saturation effects of water and increase signal intensity, or b) the $T_2$-relaxation time to decrease signal intensity in the DTI image series. Both types of dopants ($T_1$- and $T_2$-altering agents) result in an alteration of the image intensity and therefore vary the SNR bias. Dopant such as heavy water can also alter SNR of the image without altering $T_1$ and $T_2$ relaxation rates. Both the matrices of capillary array compartments and the free-water compartments contain this variation in contrast dopants.

As shown in FIG. 6, the housing 302 further includes one or more rods 320 attached to the exterior of the housing to aid in the proper alignment of the phantom 300 in the imaging plane of the MRI system. For example, two such rods 320 can be configured into a "fiducial cage," although any suitable number of rods can be used and still be within the scope of the present invention. The first rod 320a can extend along the length of the housing and over the front face, along the opposing length, and across the rear face of the housing. The second rod 320b of substantially the same length and configuration can be offset from the first rod by about 90°. Thus, the rods 320a and 320b cross each other at approximately the centers of the front and rear faces of the cylindrical housing, thereby forming a "cage" around the housing. Alternatively, a single, continuous rod-like structure can be used to form the cage amount the housing 302.

Preferably, the one or more rods 320 are constructed of a substantially rigid and durable material, such as but not limited to as plastics (polypropylene, polyethylene, etc.), PMMA, and glass. The rods 320 can be adhered to the housing 302 with a suitable glue or adhesive. Alternatively, the housing 302 can include a plurality of slots into which the rods are slid and secured (as per a mortise and tenon joint, for example). Other suitable fasteners and fastening techniques can be employed to secure the rods 320 to the housing 302.

Also preferably, the rods 320 are completely or substantially filled with water so that they can function as fiducials to provide imaging landmarks for proper alignment of the imaging plane with respect to the capillaries in the compartments 308a-308p. Given that the rods 320 are preferably in permanent alignment, the imaging plane can be prescribed in a variety of different directions, from which the angle with respect to the capillaries will be known. This feature allows for the testing of the measured eigenvector directions, given the actual orientation of the capillaries.

An alternative configuration for the rods is described in U.S. patent application Ser. No. 12/220,172, which is expressly incorporated herein by reference for all purposes.

Optionally, the housing 302 can be wrapped with a thermal insulating material so as to keep the temperature (and the corresponding diffusivity within the compartments) constant. Additionally or alternatively, the housing 302 can be wrapped with thermal tubing 330, as shown in FIG. 8, so as to control the range of measurable eigenvalues by changing the temperature of the phantom. As shown in FIG. 8, a coil of plastic tubing 330 connected to a water bath circulation device (not shown) can provide a stable temperature during measurement as well as the adjustment of temperature. Raising or lowering the temperature should raise or lower all the measured diffusion eigenvalues collectively. Thus by changing the temperature, the range of eigenvalues can overlap more fully with realistic, measured values in tissue.

In an example manner of use, when the phantom 300 is imaged with a DTI sequence, the range of SNR values can be adjusted by scanning the phantom multiple times with the identical sequence, then averaging images in the DTI series together. SNR can be measured using the following formula:

$$SNR = \frac{<I_{compartment}>}{0.66\sigma_{air}}$$

Here, $I_{compartment}$ is the image intensity averaged within an ROI ("region of interest") in a compartment, and $\sigma_{air}$ is the standard deviation of image intensities calculated within an ROI outside of the phantom 300, where no signal should exist.

In summary, one would in practice preferably scan the phantom 300 a number of times using the same protocol, for averaging series together to increase SNR as well as for imaging after manipulating the phantom temperature to increase the range of measurable eigenvalues.

Accordingly, the configuration of the phantom 300 provides a reasonable amount of quality assurance by having at least two matrices of compartments. The first matrix 304 includes capillaries in the compartments 308a-308p, where the size varies from compartment to compartment and the contrast dopant varies from compartment to compartment. In this manner, a practitioner can look at a range of eigenvalues from compartment to compartment, which can be calculated using regions of interest in the images with different signal intensities (and corresponding signal-to-noise ratios) from compartment to compartment. Thus when the phantom 300 is imaged with a DTI sequence, all of the measurements of eigenvalues (three per image pixel in a region of interest) should be the same for a given capillary size. Any differences can be attributed to the introduction of systematic errors from the MR scanner system or increases in noise relative to signal (as manipulated by dopants in the compartments 308a-308p), and that difference typically is of a different magnitude for each different capillary size.

In other words, by design, the phantom 300 allows for some degree of relative self-verification. Examining the capillary macro-array compartments 308a-308p, each column would yield the same trio of eigenvalues if there were no SNR bias. Furthermore, the second and third largest eigenvalues would be the same if there were no SNR bias because of the cylindrical symmetry of the capillaries. Considering the compartments 310a-310p (having no capillaries), all three eigenvalues for all compartments 310a-310p should be identical for no SNR bias, as diffusion in water is isotropic. Differences from those noted above result from the SNR bias that is to be determined.

In an alternative embodiment, the compartments 308, 310 are filled with one or more fluids in addition to or other than water that have different diffusivities. Such fluids can include, but are not limited to, mineral oil and alkanes. In this manner, those skilled in the art will understand that even though the eigenvalue would be the same within a plane, the eigenvalue along the axis of the arrays would vary from plane to plane.

Figure 9:
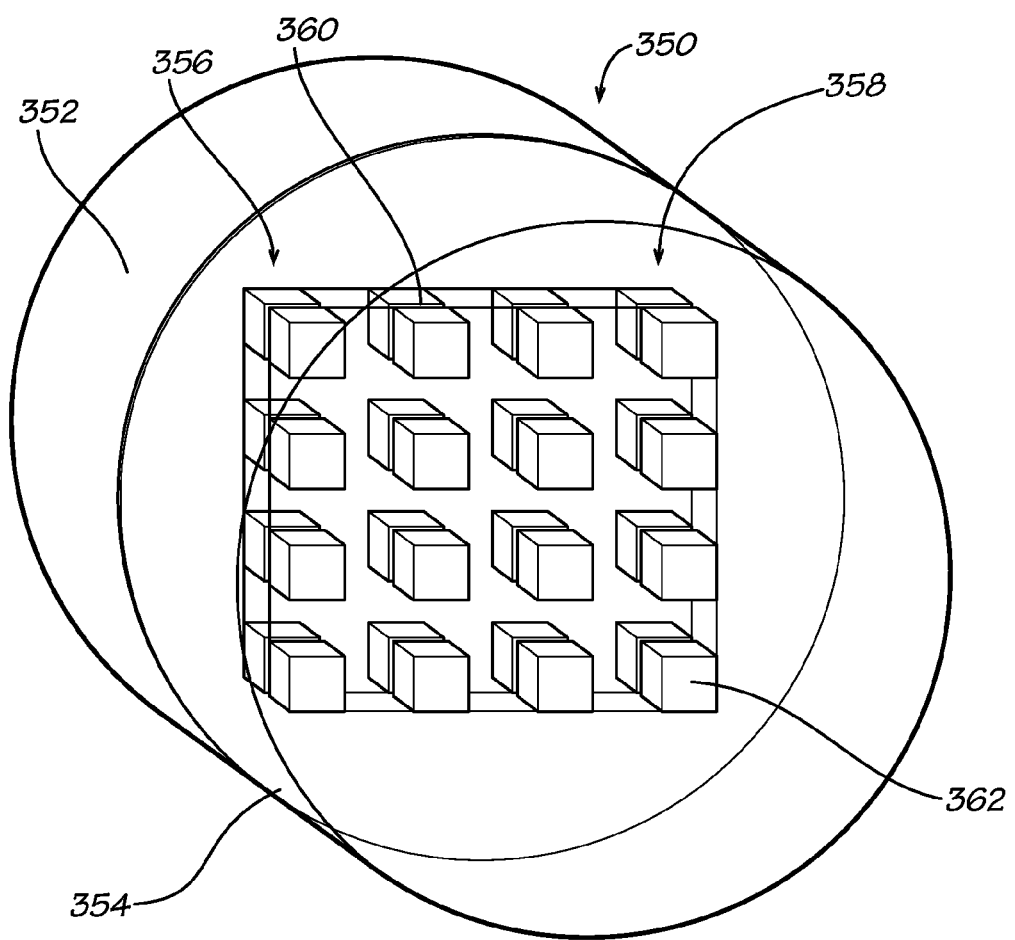
FIG. 9 depicts a perspective view of a phantom for use with DTI imaging according to a fifth example embodiment.

In still an alternative embodiment as shown in FIG. 9, a modular phantom 350 can be used. The phantom 350 includes a plurality of housings, wherein each housing comprises a matrix of compartments of capillary arrays or compartments of water and a mixture of water and dopant. Two such housings 352, 354 are depicted, although those skilled in the art will understand that additional housings can be employed. Also as shown, each housing 352, 354 can comprise a single matrix 356, 358 of compartments 360, 362. Preferably, each housing 352, 354 includes a fastener portion (not shown for purposes of clarity) for mating with a cooperating fastener of another housing. As such, two or more housings can be mated together. For example, the housings 352, 354 can be secured to one another with nylon screws, although other suitable fasteners and fastening techniques can be employed. If two generally cylindrical housings are used, then the housings can be mated at their respective faces.

With such a modular arrangement, the matrix 356 in housing 352 can include a plurality of arrays arranged in the manner disclosed in FIG. 1, while the matrix 358 in housing 354 can include a plurality of arrays arranged in the manner disclosed in FIG. 4. Also with such a modular arrangement, the phantom 350 can be modified or customized for a particular application where it may be advantageous to have a first matrix with certain features and one or more additional matrices with certain other additional features.

EXAMPLE APPLICATIONS OF THE INVENTION

Prior to describing the system and method of the present invention, a review of how a DTI sequence measures diffusion is now discussed. Use of a Stejskal-Tanner sequence to measure water diffusion in tissue along a particular direction, $\hat{r}_i$, allows for the diffusion to be calculated in an image voxel according to this familiar equation:

$$S_i = S_o e^{-b_i d_i} \quad (1)$$

Here, $d_i$ is the apparent diffusion coefficient (ADC) measured along the direction $\hat{r}_i$. The measurement of ADC using a single diffusion-weighted (DW) image or a multi-direction DTI sequence requires the acquisition of an additional image with no diffusion weighting (a "b=0" image). In the above equation, $S_i$ is the DW-signal, and $S_o$ is the signal without any diffusion weighting. Both images share the same contrast weighting contribution from $T_2$ relaxation. The additional diffusion weighting for $S_i$ is controlled using magnetic gradients and is characterized by the parameter b, given by the following equation:

$$b_i = |g_i|^2 \gamma^2 \delta^2 \left( \Delta - \frac{\delta}{3} \right) \quad (2)$$

The strength, duration, and separation of the diffusion gradient pulses applied along $\hat{r}_i$ are given as $|g_i|$, $\Delta$ and $\delta$, respectively. $\gamma$ is the gyromagnetic ratio of the proton.

Assuming that 3D tissue diffusion can be represented using a diffusion tensor, D, the measured ADC value is the projection of the tensor along the gradient direction: $d_i = \hat{r}_i^T D \hat{r}_i$. One can apply a rotation, R, to the gradient coordinate system such that the eigenvectors of the tensor align with the coordinate axes:

$$d_i = \hat{r}_i^T D \hat{r}_i \quad (3)$$
$$= \hat{r}_i^T R^T D_\| R \hat{r}_i \quad (4)$$
$$= \hat{p}_i^T D_\| \hat{p}_i \quad (5)$$

In the coordinate system of the diagonalized tensor $D_\|$, the ADC value is sampled along some direction $\hat{p}_i = [\cos \theta_i; \cos \phi_i \sin \theta_i; \sin \phi_i \sin \theta_i]$, related to the gradient direction via the rotation R: $\hat{p}_i = R \hat{r}_i$.

$$d_i = \hat{p}_i^T D_\| \hat{p}_i \quad (6)$$
$$= \sum_{j=1}^{3} \lambda_j p_{ij}^2 \quad (7)$$
$$= \lambda_1 \cos^2 \theta_i + \lambda_2 \cos^2 \phi_i \sin^2 \theta_i + \lambda_3 \sin^2 \phi_i \sin^2 \theta_i \quad (8)$$

Figure 10:
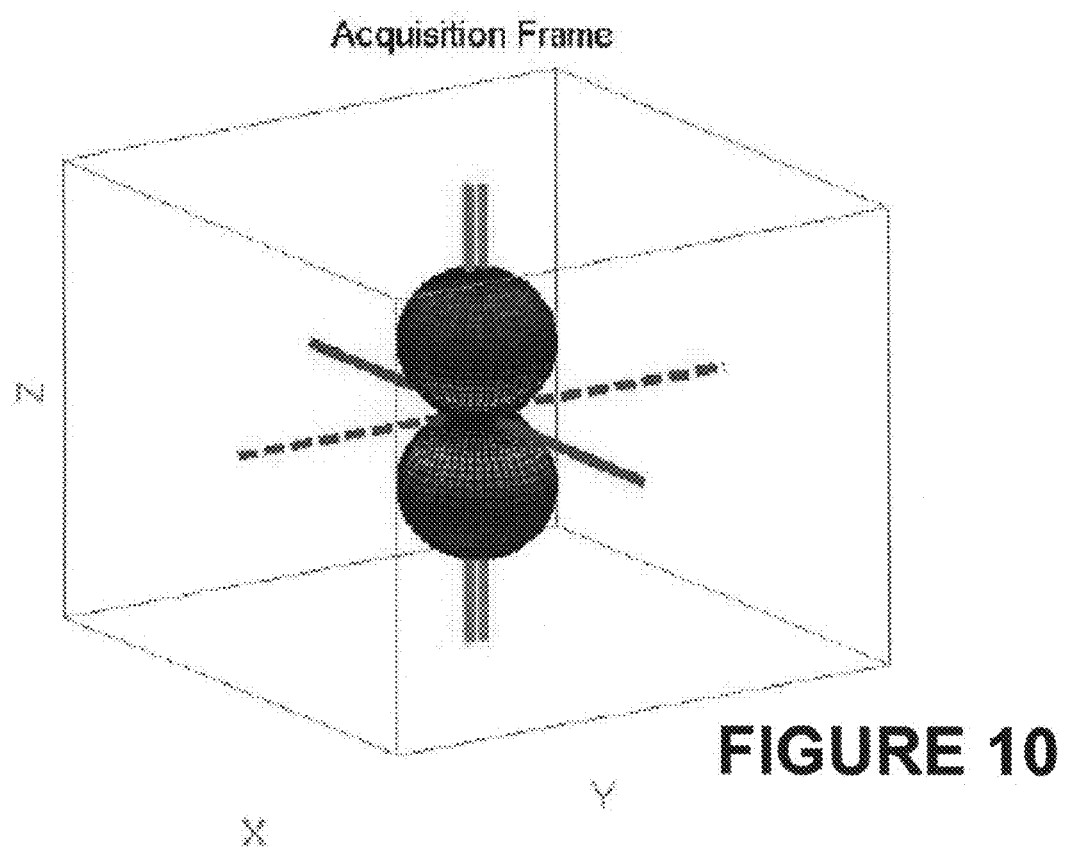
FIG. 10 depicts an acquisition frame from which a plurality of apparent diffusion coefficients ("ADCs") is acquired.

Here, $\lambda_i$ are the eigenvalues of the tensor, which lie along the x; y; z-axes in the frame of the diagonalized tensor. Because of the squared directional term in Equation 7, the sampled ADC distribution is proportional to the square of the angular distribution function describing actual diffusive behavior. For tensors with prolate symmetry (i.e., one large eigenvalue and two smaller, equal eigenvalues), associated with capillary structures, the distribution in Equation 5 forms the familiar "peanut" shape as depicted in FIG. 10 of the ADC distribution. Assuming cylindrical symmetry of the structure being imaged with the axis having the largest eigenvalue aligned along the z-axis, this distribution will specify an ADC value that can be measured by applying a gradient at the azimuthal and zenith angles ($\phi_i$; $\theta_i$) to the image plane.

The effect of systematic error or noise on the determination of $d_i$, leading to uncertainty or bias in eigenvalues, can be understood using Equations 1 and 2. Unstable or erroneous gradient performance can affect b, which can modulate $S_i$, $d_i$, and measurements of the tensor positively or negatively. On the other hand, noise in magnitude images follows a Rician distribution, adding a positive contribution to $S_i$ and to the non-DW b=0 signal ($S_o$) to a lesser extent. In general, this raises the value of $S_i$ when it becomes comparable to the mean value of noise, decreasing the measured value of $d_i$.

Method of Imaging the Phantom and Calculating Multi-Parameter Map

Figure 11:
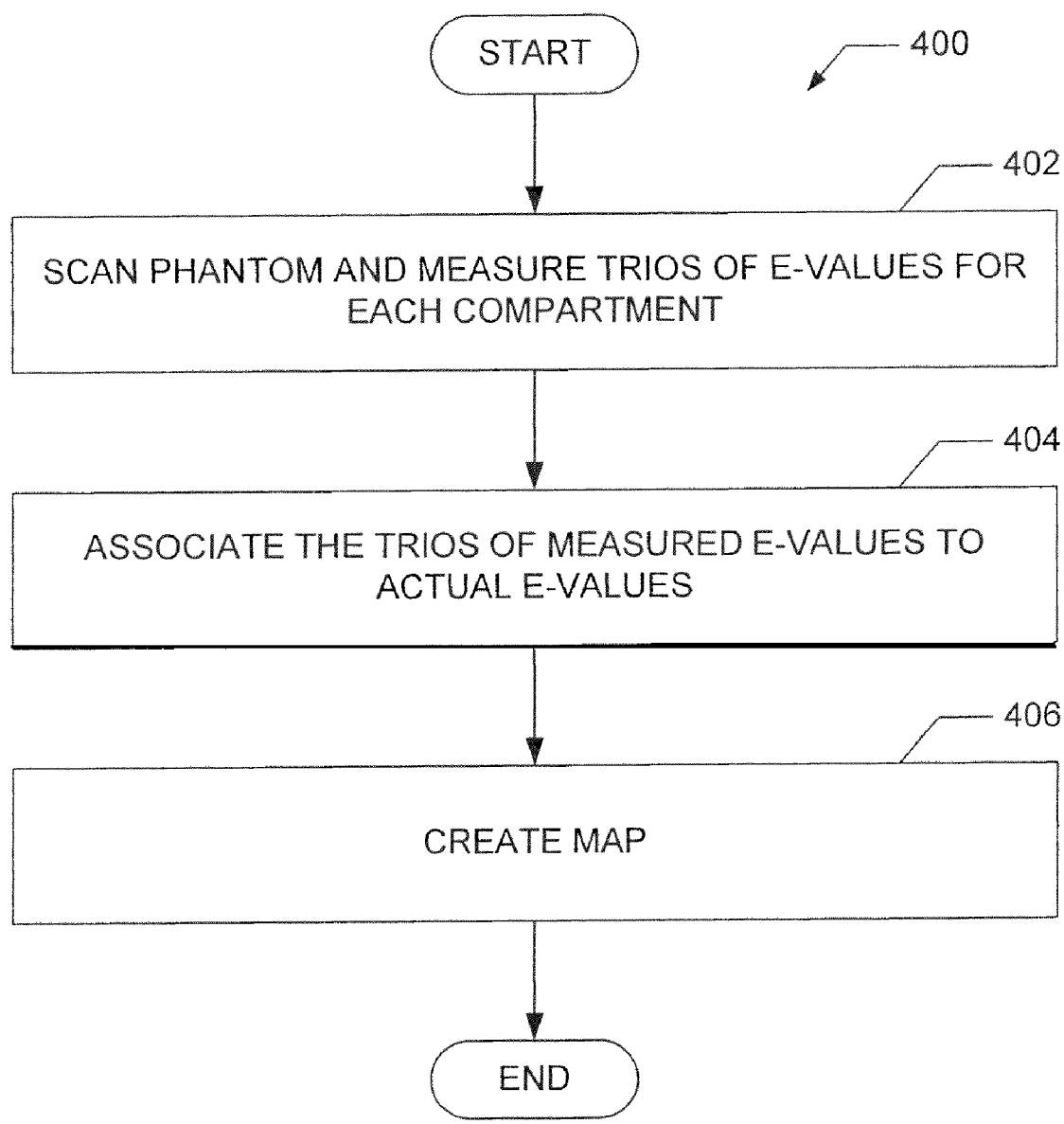
FIG. 11 depicts a flow diagram of a method for parametric mapping for correction of noise-based systematic bias of DTI metrics using the phantom of FIG. 6 according to an example embodiment of the present invention.

Referring now to FIG. 11, a flow diagram of a method 400 according to an example embodiment of the present invention for parametric mapping for correction of noise-based systematic bias of DTI metrics using the phantom 300 is depicted. Beginning at step 402, the phantom 300 (of FIGS. 6-8) is scanned multiple times using a DTI protocol to produce a dataset of measured e-values. As shown in FIG. 6, the phantom 300 is placed in the coil of an MRI machine with front view facing forward, such that the front view represents an axial orientation, for example. However, the phantom can be oriented in any other orientation (e.g., coronal, oblique), if dependencies of DTI performance on orientation were a desired goal of measurements. In the example using axial orientation, positioned in this manner, the rods 320 of the fiducial cage are used to align the planes of the axial images such that they intersect the phantom compartments (and capillary arrays) perpendicularly. Regardless of the orientation, the rods of the fiducial cage provide directional references to the imaging plane orientation (and the corresponding direction of gradients, $d_i$, applied during DTI) and the direction of the capillary arrays in the phantom compartments.

As discussed herein, design elements of the phantom 300 allow for self-consistent verification of whether measured e-values are affected by SNR-based bias (but not necessarily verification of other sources of bias):

Capillary compartments 308a-308p: the principle diffusion e-values should point along the axis of the capillary arrays, constraining the other two e-values to point across the diameter of the capillaries. The smallest two e-values should be equal.

The trio of measured e-values for compartments 308a-308p containing capillaries of equal size should be the same.

Water-filled compartments 310a-310p: diffusion is isotropic; therefore, all three e-values should be equal in any water-filled compartment.

Because water flows freely along the capillary axis, the largest e-value measured for the capillary should be equal to any of the water-filled compartment e-values.

Four columns of compartments 308a-308p exist for each capillary size, with each compartment doped to yield a slightly different SNR value. Accordingly, the performance of all compartments for a given capillary size should differ only by the SNR bias.

Differences from those noted above result from the SNR bias, characterized by the smallest e-value biased to a smaller value than it should be, and the largest e-value biased to a larger value.

The phantom 300 is imaged a sufficient enough times to provide images for yielding unbiased "gold-standard" or "actual" e-values at very high SNR (where bias is diminishingly small); for averaging series together to achieve higher SNR than in a single acquisition; and for acquiring series that can be scaled to expand the e-value range. In an example embodiment, the phantom 300 is scanned at least six times. A large number of averages substantially, if not completely, removes bias altogether from the free water and array compartments of the phantom 300 having the highest intrinsic SNR after doping. The e-value data from such averaging are considered the "gold-standard" (or "actual") e-values, for the prolate and homogeneous diffusion occurring in the phantom. Each scan of the phantom 300 defines a map over a range of SNR and diffusivity; multiple scans of the phantom complete the map over a larger range. Preferably, the phantom 300 undergoes multiple repetitions for averaging, to modulate further the dynamic SNR range.

Then, the temperature is adjusted in intervals of about 10° F. to about 20° F. over a temperature range of about 40° F. (which is a temperature slightly warmer than the freezing point of water) to about 100° F. (which is approximately body temperature). Preferably, the same number of images acquired at each temperature point to obtain additional measured e-values. Also preferably, image series at different phantom temperatures are acquired to modulate the diffusivity range substantially.

At step 404, the trios of measured e-values that are affected by bias are associated to actual e-values, for a given SNR value. The measured "gold-standard" e-values can be considered the actual e-values; however, dyadic sorting can also be used to determine actual e-values if time is not permitting to measure the very high SNR "gold-standard" data. Dyadic sorting will lead to a less-accurate determination of actual e-values, but it may be employed under circumstances (such as under circumstances of time constraint). Over the range of SNR values that are measured in all compartments (whether in a single DTI series or using multiple series averaged together), differences may be noted in some or all compartments. If significant differences are noted in some compartments of high SNR value but not in all, the actual e-values for a given SNR value can be considered equal to the measured e-values in the high SNR compartment in addition to the "gold-standard" e-values. If differences are noted in all compartments, then one can use the technique of dyadic sorting in each compartment to reduce the bias significantly within a large ROI. Validation of the use of sorting to determine the gold-standard for non-prolate data can proceed by comparing the gold-standard prolate e-values and those obtained using dyadic sorting for lower SNR. Uncertainty can be assigned to this mapping based on the range of actual e-values that can result from measurement error.

The trios of measured e-values that are affected by bias are associated to actual e-values, for a given SNR value in a map at step 406. An example map is shown in the pictorial representation of FIG. 12. The map is unique to the specified DTI protocol, so in an example embodiment, a standard clinical protocol is chosen for determining the relationship between actual and measured e-values of the phantom 300. The process for developing and using this map is shown schematically in FIG. 12. For each DTI scan of the phantom 300, data from an ROI in one compartment will produce three mean e-values and associated uncertainty (Box 1 in FIG. 12). Because these data were measured at the mean SNR value of the compartment, their mean values and uncertainties fill a small region of four-dimensional space with the dimensions (E1, E2, E3, $SNR_{measured}$), where E1 is the largest e-value and E3 is the smallest. Hereafter, this space will be referred to as "measurement e-space". Measured at a very high SNR, the mean measured e-values in a compartment will be relatively unbiased and can be considered the "actual" e-values (i.e., "gold-standard"). The set of actual e-values is located in a three-dimensional space, hereafter referred to as "actual e-space", with the dimensions (E1', E2', E3'). SNR is not a dimension of actual e-space because the unbiased e-values are not dependent upon this parameter, by definition.

Figure 12:
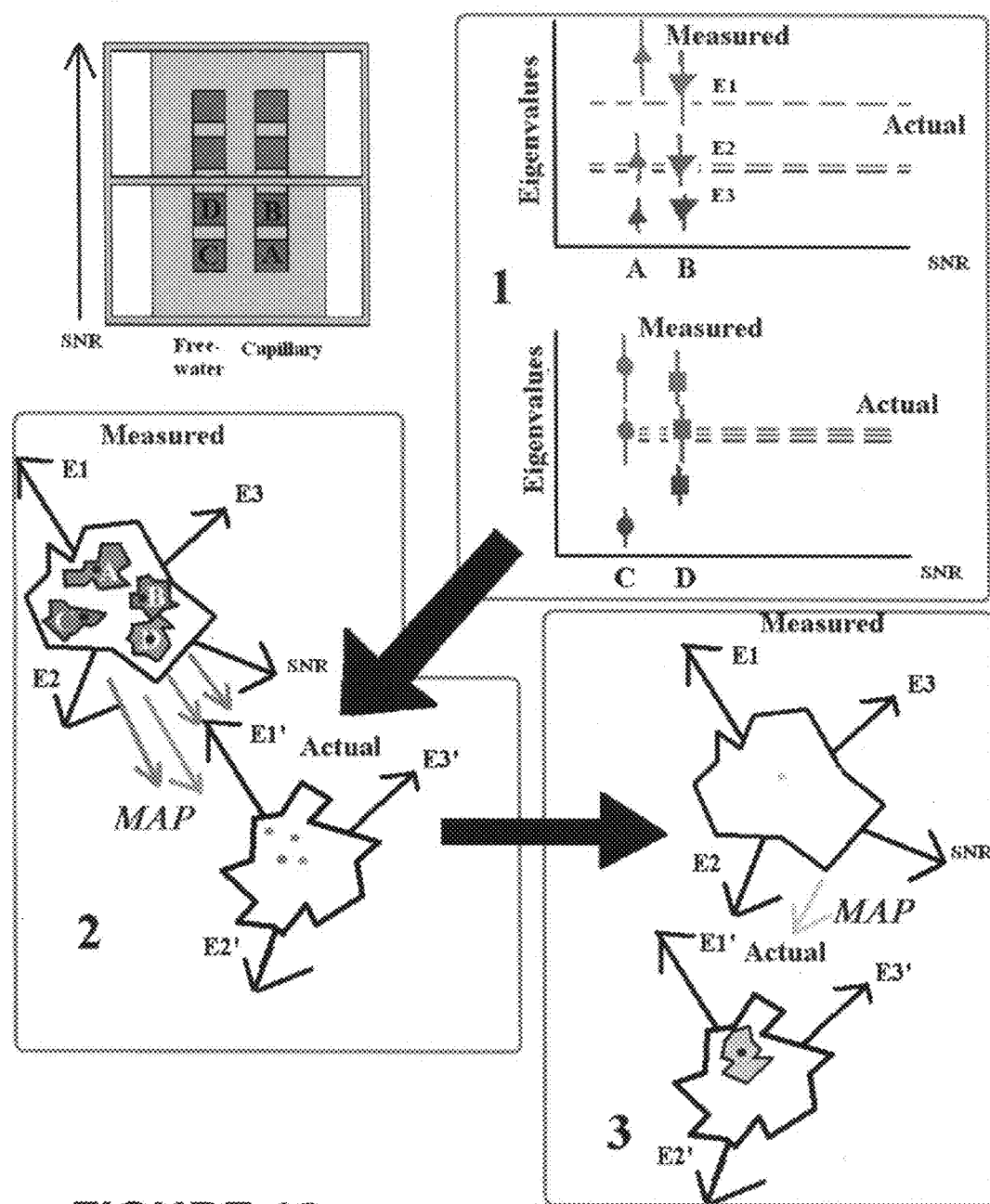
FIG. 12 depicts a schematic representation for developing and using the map created by the method of FIG. 11.

The association of actual e-values with measured e-values constitutes part of a map, shown in Box 2 in FIG. 12. Considering the inverse map at a measured SNR value, each point in the actual e-space maps to a region with some confidence, associated with the measurement uncertainties determined during the development of the map. Given a single measurement of e-values at one SNR value, this data maps to a confidence region in actual e-space instead of a point, where the confidences are derived from the original measurement uncertainties. The following steps provide more details as to how to develop the map.

Following the schema in FIG. 12, the first step for producing a map involves determining the measured e-values and uncertainties, and SNR. Individual 2D images are recombined into 3D volumetric images, yielding 16 volumes (12 diffusion-weighted volumes plus 4 b=0 volumes). The first two b=0 volumes are discarded to avoid non-steady-state magnetization behavior, while the last two b=0 volumes are averaged together. Given the imaging sequence, diffusion tensors for each image voxel can be calculated using MATLAB software (Mathworks, Inc., Natwick, Mass.) that finds diffusion tensors via the linear least-squares method. After diagonalization of the tensor, e-values for each voxel are sorted by magnitude. After an ROI is delineated for each compartment, the mean and standard deviations of the three e-values are calculated for each ROI. The SNR value used in the mapping process, $SNR_{map}$, is calculated in the following manner. For each voxel in an image, the SNR is given by following expression:

$$SNR_v = \frac{I_{voxel}}{\sigma_{air}/0.66} \qquad (9)$$

Here, $I_{voxel}$ is the signal intensity in a voxel, and $\sigma_{air}$ is the standard deviation of signal intensity within an ROI drawn in a region of air outside the phantom. The numeric factor accounts for the fact the noise within magnitude images follows a Rician distribution. Within a DTI scan, the apparent diffusion coefficient is sampled along particular directions, with the magnitude $ADC_i$ along a direction being given as follows:

$$ADC_i = \frac{-1}{b_i} \ln\left(\frac{S(b_i)}{S(b=0)}\right) \qquad (10)$$

Here, S(b) is the signal intensity in a voxel after the application of a diffusion gradient, and S(b=0) is the signal intensity with the gradient turned off ("b=0 image"). From this equation, the error in determining ADC associated with the SNR relies on both S(b) and S(b=0). Defining the term inside the parentheses in Equation 10 as f and applying the chain rule to evaluate the expression for error, we derive the following result:

$$\frac{\sigma_f^2}{f^2} = \frac{\sigma_{S(b)}^2}{S(b)^2} + \frac{\sigma_{S(b=0)}^2}{S(b=0)^2} \qquad (11)$$

$$= \frac{1}{SNR_{S(b)}^2} + \frac{1}{SNR_{S(b=0)}^2}$$

The last equation recognizes that each term of the form $\sigma_x^2/x^2$ is equivalent to $1/SNR^2$ if $\sigma$ is the error from image noise. Therefore, a composite SNR value for each direction sampled can be defined as:

$$SNR_{composite} = \frac{f}{\sigma_f} \quad (12)$$

$$= \sqrt{\frac{1}{1/SNR_{vS(b)}^2 + 1/SNR_{vS(b=0)}^2}}$$

$$= \sqrt{\frac{SNR_{vS(b)}^2 \cdot SNR_{vS(b=0)}^2}{SNR_{vS(b)}^2 + SNR_{vS(b=0)}^2}}$$

Note that use of this expression is slightly different from prior art reports, where SNR values for all images are added together or the SNR for only the b=0 image is reported. Because both S(b) and S(b=0) contribute to each calculated value of $ADC_i$ using the least-squares technique for calculating the tensor, this expression combines their separate errors more rigorously. Using the DTI protocol of the present invention, SNR for b=0 should correspond to the two volumes averaged together. Finally, the value of SNR used during the mapping process ($SNR_{map}$) is the average of $SNR_{composite}$ over all directions. In a similar fashion, the mean $SNR_{map}$ value within an ROI is simply the mean of all values for a voxel.

Before calculating the full map from measurement to actual e-space (Box 2 in FIG. 12), the actual e-values are determined. The SNR bias is significantly diminished at very high SNR (such as an SNR greater than 40), meaning that the measured e-values are equivalent to unbiased e-values. Six or more DTI image series are preferably averaged together to achieve high SNR, after which the actual e-values are set to these mean measured e-values (the "gold standard"). A simple verification of the integrity of this standard will include insuring that the smallest e-values are equivalent for the capillary ROIs, that all three e-values are equivalent for the free-water ROIs, and that the largest e-value for capillary ROIs is equivalent to any of the e-values for the free-water ROIs.

Measured and actual e-values for geometry other than prolate or spherical can be synthesized from phantom scans using the scaling methods described in U.S. patent application Ser. No. 12/220,172, filed on the same date as the present application and titled "SYSTEMS AND METHODS FOR RESCALING IMAGE INTENSITIES WITH DIFFUSION MRI TO SYNTHESIZE COMPLEX DIFFUSIVE GEOMETRIES," which is incorporated herein by reference for all purposes. Thus, data for a number of image series are scaled such that the e-values are consistent with non-prolate and non-spherical geometry. Considering the smallest e-value of the smallest capillary at the lowest temperature to be a lower bound and the largest e-value of free water at the highest temperature to be an upper bound, all three measured e-values for any imaging run designated for scaling are scaled independently between these two bounds. To arrive at the gold-standard, actual e-values for these scaled runs, dyadic sorting can be used within the ROIs of each compartment. The accuracy of the gold standard for these scaled data can be verified by sorting measured prolate e-values at this SNR and comparing these results to the high SNR, gold-standard prolate e-values. Measurement of the equivalency of these two suggests sufficient accuracy using dyadic sorting to establish the non-prolate gold standard e-values. Assuming that each compartment has approximately 680 voxels, the ROIs should be adequate at SNR of approximately 18 to determine the mean of both small e-values to greater than 99% accuracy after dyadic sorting. Inaccuracy can be quantified and propagated to the map.

In an alternative embodiment, rather than applying the rescaling methods described above, one could also use the methods described in U.S. patent application Ser. No. 12/220,172, titled "TEST OBJECT FOR USE WITH DIFFUSION MRI AND SYSTEM AND METHODS OF SYNTHESIZING COMPLEX DIFFUSIVE GEOMETRIES USING NOVEL GRADIENT DIRECTIONS", which is incorporated herein by reference for all purposes. Thus, data for a number of image series are collected using novel gradient directions such that the e-values are consistent with non-prolate and non-spherical geometry. To arrive at the gold-standard, actual e-values for these scaled runs, dyadic sorting can be used within the ROIs of each compartment. The accuracy of the gold standard for these scaled data can be verified by sorting measured prolate e-values at this SNR and comparing these results to the high SNR, gold-standard prolate e-values. Measurement of the equivalency of these two suggests sufficient accuracy using dyadic sorting to establish the non-prolate gold standard e-values. Assuming that each compartment has approximately 680 voxels, the ROIs should be adequate at SNR of approximately 18 to determine the mean of both small e-values to greater than 99% accuracy after dyadic sorting. Inaccuracy can be quantified and propagated to the map.

Once the measured e-values are associated with the actual e-values, the user will have set of three mean e-values that have been measured at a particular SNR, that correspond to another set of actual e-values without bias. Furthermore, a range of individual e-values can be noted in each voxel of a compartment, corresponding to a range in the systematic biasing effect for a given mean SNR value.

The map and confidence intervals can be developed. Data for all measured triplets of e-values at all SNR values can be incorporated into the parametric mapping function. The mapping function can be determined using a multi-dimensional polynomial approximation, which maps measured e-values to actual e-values for a given SNR. Given the measured and actual e-values, FA (fractional anisotropy) values for each of these can be calculated as well, leading to an FA map. Confidence intervals can be defined based on the uncertainty in the data and the total least squares error in the determination of a map.

A simpler, graphical example of the method of creating a parametric map is described with reference to the following example.

EXAMPLE

Figure 13A:
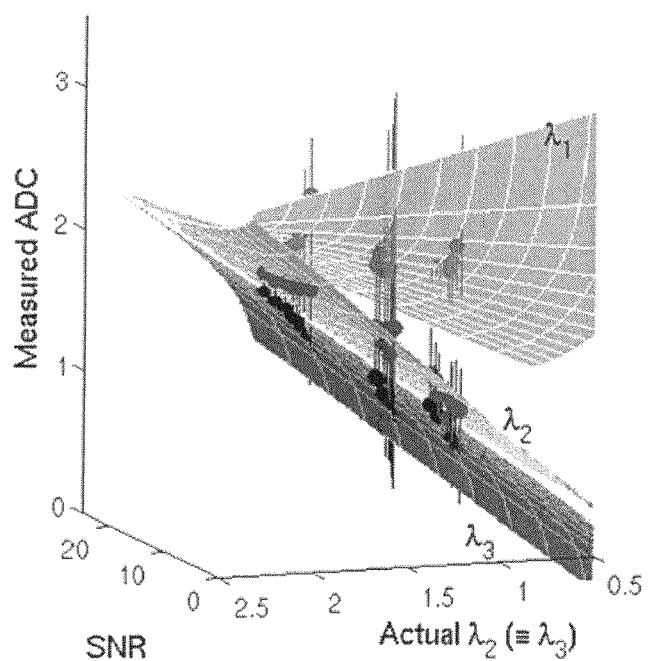
FIGS. 13A-13C demonstrate schematically the generation and use of a bias-correction map according to an example embodiment of the present invention.
Figure 13B:
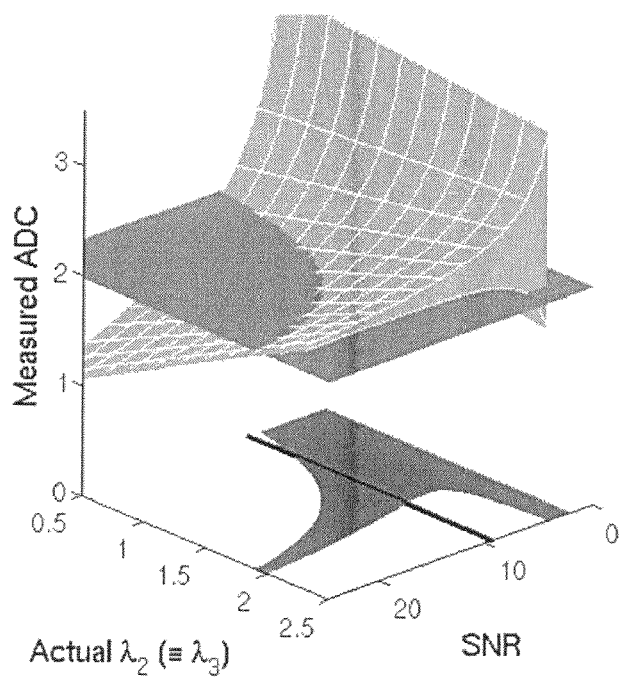
Figure 13C:
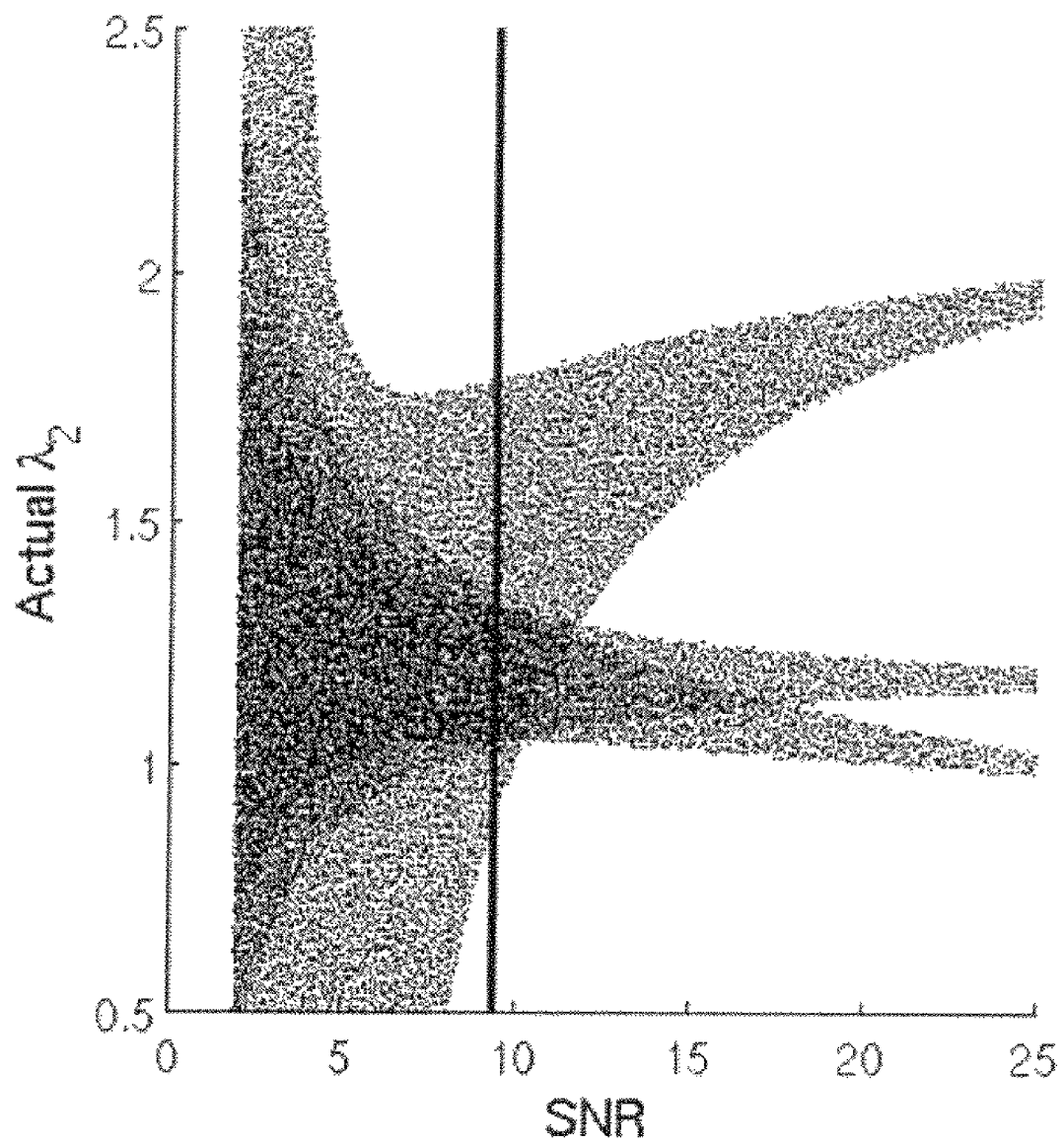
Figure 14:
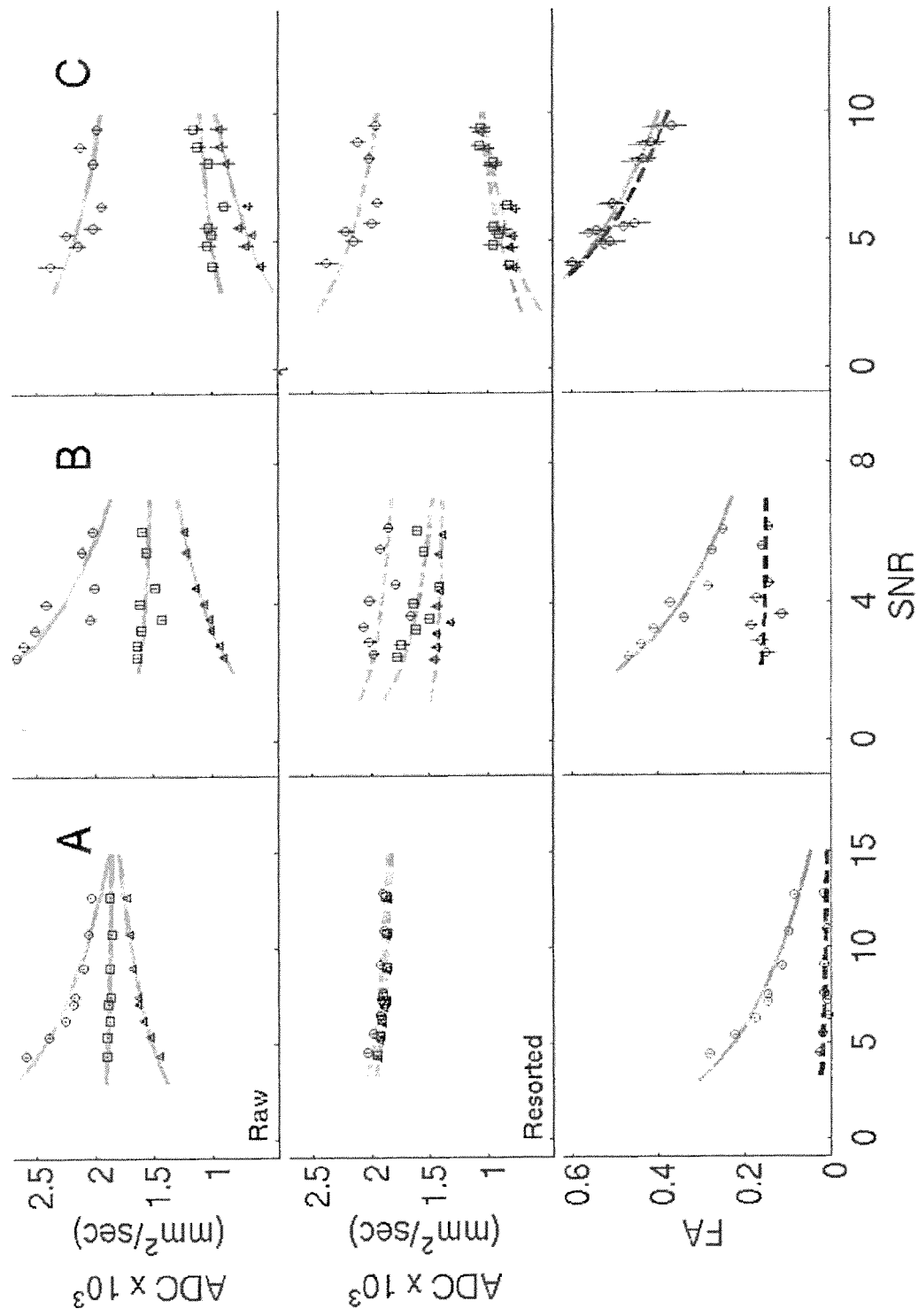
FIG. 14 depicts a graphical plot of tensor e-values and FA used in the map of FIGS. 13A-13C.

FIGS. 13A-C demonstrate schematically how one could generate and use such a bias-correction map in the simple case that the underlying tissue structure exhibits prolate diffusion characteristics, at a particular temperature. If one assumes that water is unrestricted along the principal axis of diffusion, a map of measured eigenvalues to actual eigenvalues can be reduced to a three-dimensional plot in the case of prolate geometry. In this case, the axes are (a) measured tensor eigenvalues, (b) the SNR of measurements and (c) the actual eigenvalue along restricted prolate axes (i.e., $\lambda_2$, which is equivalent to $\lambda_3$ for prolate symmetry). In FIG. 13A, the magnitude-sorted data presented in FIG. 14 have been plotted after determining the actual eigenvalue with dyadic sorting. FIG. 14 depicts a graphical plot of tensor e-values and FA, averaged within ROI, before (solid lines) and after (dashed lines) dyadic sorting. Column A depicts tensor e-values and FA obtained from a scan of a free-water ROI. Column B depicts tensor e-values and FA obtained from a scan of a capillary array wherein each capillary has an i.d. of approximately 82 μm. Column C depicts tensor e-values and FA obtained from a scan of a capillary array wherein each capillary has an i.d. of approximately 23 µm. The top row shows all three e-values before sorting, and the middle row shows the e-values after sorting. Error bars represent the measurement standard error of the means. Presorted and postsorted FA values are plotted in the bottom row.

Each magnitude-sorted eigenvalue lies on a plane that represents how magnitude sorting biases the measurement as a function of SNR. The functional shape of the plane in this example in FIG. 13A, fit to the data using least squares, was assumed to have a logarithmic dependence on SNR and a linear dependence on both measured and actual ADC values. Although this fit is adequate for a discussion of corrective mapping, data sampled less sparsely would allow spline fitting of a plane for a more accurate description of the data.

Once the planes for each eigenvalue have been determined, future measurements can be mapped to actual values using these planes in the following manner. Each eigenvalue plane has a corresponding uncertainty that depends on the value of SNR. FIG. 13B plots the region surrounding the eigenvalue plane within 1 S.D. as a solid, showing only the largest eigenvalue for clarity. A plot of a given eigenvalue measurement would fall on a plane, shown in this example as a dark gray region that cuts through the solid defining eigenvalue uncertainty. The intersection of the plane and the solid, which represents a region of actual eigenvalues and SNR values that the measured eigenvalue is associated with for a particular confidence interval, is projected onto the x-y plane. Coupled with a measurement of the SNR (shown as a black line), the actual eigenvalue can be narrowed down to a range with a given confidence.

The intersection of the measurement plane and the region of uncertainty surrounding the fit eigenvalue plane can be determined for all three measured eigenvalues. FIG. 13C shows a superposition of all three of these intersecting regions. Given an SNR measurement, the range of highest confidence for the actual eigenvalue can be found along a line, in the area where all three intersecting regions overlap.

In general, the maps created in by the process 406 of FIG. 11 and shown representatively in Panels 2-3 in FIG. 12 would not be graphically representable as in the simple example shown in FIGS. 13A-C. Most generally, the maps would translate measurements from 4D measurement e-space to 3D actual e-space (see FIG. 12); as such, a full graphical representation would involve seven dimensions instead of three. Nevertheless, the methods described in the simple example can be generalized to seven dimensions mathematically, substituting volumes for the splined planes.

Figure 15:
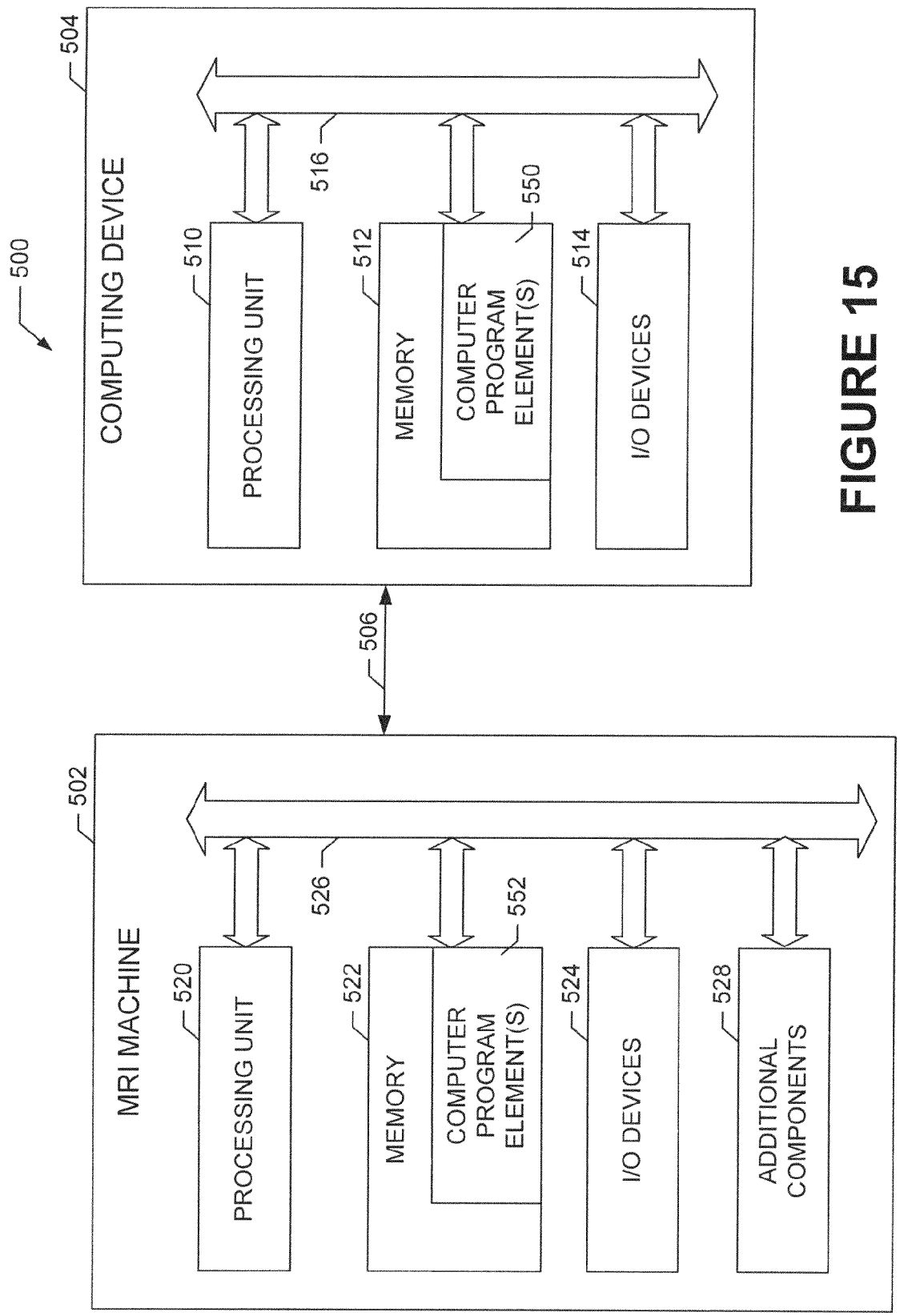
FIG. 15 depicts a block diagram of an example of a suitable computing system environment on which the invention may be implemented.

FIG. 15 depicts a block diagram of an example of a suitable computing system environment 500 on which the invention may be implemented. The computing system environment 500 is only one example of a suitable computing environment and is not intended to suggest any limitation as to the scope of use or functionality of the invention. Neither should the computing environment 500 be interpreted as having any dependency or requirement relating to any one or combination of components illustrated in the exemplary operating environment.

For example, the computing system environment 500 can be implemented on a conventional MRI machine and/or it can be implemented on other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, telephony systems, distributed computing environments that include any of the above systems or devices, and the like.

With reference to FIG. 15, an exemplary system 500 for implementing the invention includes a conventional MRI machine 502 configured for DTI imaging coupled to a general-purpose computing device in the form of a computer 504. The MRI machine 502 can be operatively coupled to the computer via a suitable interface 506, such as a cable or via one or more networks, such as but not limited to: the Internet, a local area network (LAN), a wide area network (WAN), via a telephone line using a modem (POTS), Bluetooth, WiFi, cellular, optical, satellite, RF, Ethernet, magnetic induction, coax, RS-485, or other like networks. In such an embodiment, data obtained from scans by the MRI device 502 can be transmitted to the computer 504 for further manipulation.

Components of the computer 504 may include, but are not limited to, a processing unit 510, a system memory 512, i/o devices 514, and a system bus 516 that couples various system components including the system memory to the processing unit. All of the components of the computer 504 are conventional and well known to those skilled in the art.

For example, the processing unit 510 is a hardware device for executing software that can be stored in memory 512. The processing unit 510 can be virtually any custom made or commercially available processor, a central processing unit (CPU), data signal processor (DSP) or an auxiliary processor among several processors associated with a server, and a semiconductor based microprocessor (in the form of a microchip) or a macroprocessor. Examples of suitable commercially available microprocessors are as follows: an 80x86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 512 can include any one or combination of volatile memory elements (e.g., random access memory (RAM, such as dynamic random access memory (DRAM), static random access memory (SRAM), etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 512 may incorporate electronic, magnetic, optical, and/or other types of storage media. Note that the memory 512 can have a distributed architecture, where various components are situated remote from one another, but can be accessed by the processing unit 510.

Input/output devices 514 can include one or more of the following: a keyboard, a microphone, a pointing device, such as a mouse, trackball or touch pad, a joystick, game pad, satellite dish, scanner, monitor, display device, speaker, printer, or the like.

The system bus 516 can be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Additionally or alternatively, the methods of the present invention can be implemented in a conventional MRI machine having computing components similar to the computer 504, including a processing unit 520, a system memory 522, i/o devices 524, and a system bus 526 that couples various system components including the system memory to the processing unit 520, in addition to the conventional MRI components 528 (such as a coil, magnets, etc.). MRI machines are well known in the art, and thus, the internal components will not be discussed in detail.

The methods of the present invention can be embodied in computer program elements 550, 552. Computer program elements 550, 552 of the invention may be embodied in hardware (such as in the processing unit 520 or memory 522 of the MRI machine 502 or in the processing unit 510 or memory 512 of the computer 504 or computing device operatively connected to an MRI machine) and/or in software (including firmware, resident software, micro-code, etc.). If implemented in hardware, a system of the present invention be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. Computer readable media can be any available media that can be accessed by a computer or computing device and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

While the invention has been described with reference to preferred and example embodiments, it will be understood by those skilled in the art that a variety of modifications, additions and deletions are within the scope of the invention, as defined by the following claims.

What is claimed is:

1. A method for evaluating data acquired through a DTI scan, comprising:
    scanning a test object having a plurality of anisotropic structures with a DTI protocol;
    measuring a plurality of eigenvalues for the test object based on the scanning;
    associating the measured eigenvalues with actual eigenvalues of the test object; and
    comparing the measured eigenvalues to the actual eigenvalues.

2. The method of claim 1, further comprising the step of creating a parametric map that links the measured eigenvalues to the actual eigenvalues.

3. The method of claim 2, further comprising using the parametric map to evaluate data obtained from a scan of human or animal tissue using the DTI protocol.

4. The method of claim 1, further comprising repeating the steps of scanning the test object using the DTI protocol and measuring a plurality of eigenvalues for the test object.

5. The method of claim 4, wherein the steps of scanning and measuring are repeated at least five times.

6. The method of claim 4, wherein the measured values are averaged.

7. The method of claim 4, further comprising the steps of adjusting the temperature of the test object, rescanning the test object at the adjusted temperature using the DTI protocol, and measuring a plurality of eigenvalues for the test object at the adjusted temperature.

8. A non-transitory computer-readable medium storing instructions that, when executed on a programmed processor, carry out a method for evaluating data acquired through a DTI scan, comprising:
    instructions for scanning a test object having a plurality of anisotropic structures with a DTI protocol;
    instructions for measuring a plurality of eigenvalues for the test object based on the scanning;
    instructions for associating the measured eigenvalues with actual eigenvalues of the test object; and
    instructions for comparing the measured eigenvalues to the actual eigenvalues.

9. The computer-readable medium of claim 8, further comprising instructions for creating a parametric map that links the measured eigenvalues to the actual eigenvalues.

10. The computer-readable medium of claim 9, further comprising instructions for using the parametric map to evaluate data obtained from a scan of human or animal tissue using the DTI protocol.

11. The computer-readable medium of claim 8, further comprising instructions for repeating the steps of scanning the test object using the DTI protocol and measuring a plurality of eigenvalues for the test object.

12. The computer-readable medium of claim 11, wherein the instructions for repeating the steps of scanning and measuring includes instructions for repeating the steps and measuring at least five times.

13. The computer-readable medium of claim 11, further comprising instructions for averaging the measured values.

14. The computer-readable medium of claim 11, further comprising instructions for rescanning the test object at an adjusted temperature using the DTI protocol, and measuring a plurality of eigenvalues for the test object at the adjusted temperature.

15. A system for evaluating data acquired through a DTI scan, comprising:
- means for scanning a test object having a plurality of anisotropic structures with a DTI protocol;
- means for measuring a plurality of eigenvalues for the test object based on the scanning;
- means for associating the measured eigenvalues with actual eigenvalues of the test object; and
- means for comparing the measured eigenvalues to the actual eigenvalues.

16. The system of claim 15, further comprising means for creating a parametric map that links the measured eigenvalues to the actual eigenvalues.

17. The system of claim 16, further comprising means for using the parametric map to evaluate data obtained from a scan of human or animal tissue using the DTI protocol.

18. The system of claim 15, wherein the means for scanning and the means for measuring are adapted for repeatedly scanning the test object using the DTI protocol and measuring a plurality of eigenvalues for the test object.

19. The system of claim 18, further comprising means for averaging the measured values.

20. The system of claim 18, further comprising means for adjusting the temperature of the test object between repeatedly rescanning the test object at the adjusted temperature using the DTI protocol and measuring a plurality of eigenvalues for the test object at the adjusted temperature.

* * * * *